(12) United States Patent
Huang et al.

(10) Patent No.: US 12,712,524 B2
(45) Date of Patent: Aug. 18, 2026

(54) ACOUSTIC FILTER AND ELECTRONIC DEVICE

(71) Applicant: Huawei Technologies Co., Ltd., Shenzhen (CN)

(72) Inventors: Yulin Huang, Chengdu (CN); Benfeng Zhang, Shanghai (CN); Xinyi Li, Shanghai (CN); Rongrong Che, Shanghai (CN); Zongzhi Gao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 108 days.

(21) Appl. No.: 18/781,266

(22) Filed: Jul. 23, 2024

(65) Prior Publication Data

US 2024/0380385 A1 Nov. 14, 2024

Related U.S. Application Data

(63) Continuation of application No. PCT/CN2022/073595, filed on Jan. 24, 2022.

(51) Int. Cl.
*H03H 9/64* (2006.01)
*H03H 9/145* (2006.01)
*H03H 9/25* (2006.01)

(52) U.S. Cl.
CPC .............. *H03H 9/64* (2013.01); *H03H 9/145* (2013.01); *H03H 9/25* (2013.01)

(58) Field of Classification Search
CPC ............... H03H 9/02015; H03H 9/131; H03H 9/02118; H03H 9/25; H03H 9/6483; H03H 9/173; H03H 9/605; H03H 9/17; H03H 9/205; H03H 9/02834; H03H 3/02; H03H 9/54; H03H 9/589; H03H 9/64; H03H 9/02574; H03H 9/725; H03H 9/02086; H03H 9/02125; H03H 9/13; H03H 9/568; H03H 9/6489; H03H 2003/021; H03H 9/02; H03H 9/02047; H03H 9/0211; H03H 9/02157; H03H 9/02818; H03H 9/175; H03H 9/02992; H03H 9/0504; H03H 9/145; H03H 9/706; H03H 2009/02173;

(Continued)

(56) References Cited

U.S. PATENT DOCUMENTS

2006/0214748 A1 9/2006 Funami et al.
2011/0032051 A1 2/2011 Kawamoto et al.

(Continued)

FOREIGN PATENT DOCUMENTS

CN 106100652 A 11/2016
CN 110089032 A 8/2019

(Continued)

*Primary Examiner* — John W Poos
(74) *Attorney, Agent, or Firm* — Conley Rose, P.C.

(57) ABSTRACT

An acoustic filter includes a first resonator, a second resonator, and a first acoustic wave suppression structure. The first resonator and the second resonator are arranged in a first direction. The first acoustic wave suppression structure is disposed between the first resonator and the second resonator, and at least one stopband generated by the first acoustic wave suppression structure is used to reduce an acoustic wave that is leaked between the first resonator and the second resonator and that is propagated in the first direction.

20 Claims, 11 Drawing Sheets

(58) Field of Classification Search

CPC .... H03H 3/08; H03H 9/14541; H03H 9/1457; H03H 9/582; H03H 9/587; H03H 9/703; H03H 2003/0428; H03H 2009/02165; H03H 3/04; H03H 9/0207; H03H 9/02078; H03H 9/02102; H03H 9/02259; H03H 9/02543; H03H 9/02685; H03H 9/171; H03H 9/174; H03H 9/6406; H03H 9/6436; H03H 9/0222; H03H 9/02228; H03H 9/02881; H03H 9/02921; H03H 9/0085; H03H 9/02716; H03H 9/02905; H03H 9/132; H03H 9/564; H03H 9/72; H03H 2003/023; H03H 3/10; H03H 9/02559; H03H 9/02637; H03H 9/02842; H03H 9/02858; H03H 9/02866; H03H 9/14544; H03H 9/14582; H03H 9/542; H03H 9/56; H03H 9/58; H03H 9/6433; H03H 2009/02503; H03H 2009/155; H03H 9/0009; H03H 9/02614; H03H 9/02661; H03H 9/0576; H03H 9/14538; H03H 9/14558; H03H 9/15; H03H 9/6426; H03H 9/6469; H03H 9/6496; H03H 9/70

See application file for complete search history.

(56) References Cited

U.S. PATENT DOCUMENTS

| | | | | |
|---|---|---|---|---|
| 2018/0254765 | A1 | 9/2018 | Inate | |
| 2020/0287519 | A1 * | 9/2020 | Kishino | H03H 9/0028 |
| 2020/0304096 | A1 * | 9/2020 | Suzuki | H03H 9/02637 |
| 2023/0163748 | A1 * | 5/2023 | Goto | H03H 9/02574 310/313 R |

FOREIGN PATENT DOCUMENTS

| | | | | |
|---|---|---|---|---|
| JP | WO2021153736 | A5 * | 9/2022 | H03H 9/145 |
| WO | 2018112921 | A1 | 6/2018 | |
| WO | 2021153734 | A1 | 8/2021 | |
| WO | 2021153736 | A1 | 8/2021 | |

* cited by examiner

ACOUSTIC FILTER AND ELECTRONIC DEVICE

CROSS-REFERENCE TO RELATED APPLICATIONS

This is a continuation of International Patent Application No. PCT/CN2022/073595 filed on Jan. 24, 2022, which is hereby incorporated by reference in its entirety.

TECHNICAL FIELD

This disclosure relates to the field of semiconductor technologies, and in particular, to an acoustic filter and an electronic device.

BACKGROUND

An acoustic filter is an important component for radio frequency signal processing, and is widely used in a radio frequency integrated circuit (RFIC) of a terminal device such as a mobile phone. A function of the acoustic filter is to block a signal at another frequency by using a signal at a specific frequency.

However, with integrated application of more frequency bands, filtering performance of the acoustic filter faces a greater challenge.

SUMMARY

Embodiments of this disclosure provide an acoustic filter and an electronic device, to improve filtering performance of the acoustic filter.

To achieve the foregoing objective, this disclosure uses the following technical solutions.

According to a first aspect, an acoustic filter is provided. The acoustic filter includes a first resonator, a second resonator, and a first acoustic wave suppression structure. The first resonator and the second resonator are arranged in a first direction. The first acoustic wave suppression structure is disposed between the first resonator and the second resonator, and at least one stopband generated by the first acoustic wave suppression structure is used to reduce an acoustic wave that is leaked between the first resonator and the second resonator and that is propagated in the first direction.

The acoustic filter provided in this disclosure includes the first acoustic wave suppression structure disposed between the first resonator and the second resonator, and the at least one stopband generated by the first acoustic wave suppression structure is used to reduce the acoustic wave that is leaked between the first resonator and the second resonator and that is propagated in the first direction. In other words, the at least one stopband generated by the first acoustic wave suppression structure may attenuate an acoustic wave that is of a specific frequency band of the acoustic filter and that is leaked from the first resonator and the second resonator. In this case, an acoustic wave that is of the specific frequency band of the acoustic filter and that is leaked from the first resonator may be suppressed from entering the second resonator, or an acoustic wave that is of the specific frequency band of the acoustic filter and that is leaked from the second resonator may be suppressed from entering the first resonator such that filtering performance of the acoustic filter can be improved.

In a possible implementation, the first acoustic wave suppression structure includes at least one acoustic wave suppression unit group, each first acoustic wave suppression unit group in the at least one acoustic wave suppression unit group includes a plurality of acoustic wave suppression units, and the plurality of acoustic wave suppression units in the first acoustic wave suppression unit group are periodically arranged in the first direction, that is, the plurality of acoustic wave suppression units in the first acoustic wave suppression unit group are arranged in sequence in the first direction based at a same spacing.

When the acoustic wave suppression unit group includes the plurality of acoustic wave suppression units, and the plurality of acoustic wave suppression units in the acoustic wave suppression unit group are arranged in sequence in the first direction at the same spacing, that is, the plurality of acoustic wave suppression units in the acoustic wave suppression unit group are arranged periodically in the first direction, a spacing between the plurality of acoustic wave suppression units in the acoustic wave suppression unit group arranged in the first direction may be adjusted, to quickly and flexibly adjust a stopband generated by the acoustic wave suppression unit group such that the at least one stopband generated by the first acoustic wave suppression structure can be used to reduce the acoustic wave that is leaked between the first resonator and the second resonator and that is propagated in the first direction.

In a possible implementation, the at least one acoustic wave suppression unit group includes a plurality of acoustic wave suppression unit groups, and spacings between two adjacent acoustic wave suppression units in different acoustic wave suppression unit groups are different. The spacings between two adjacent acoustic wave suppression units in different acoustic wave suppression unit groups are different. Therefore, when a material of the acoustic wave suppression unit is determined, different acoustic wave suppression unit groups correspondingly generate different stopbands such that the first acoustic wave suppression structure can generate a plurality of stopbands.

In a possible implementation, a length that is of the first acoustic wave suppression structure and that is in a second direction is greater than a length that is of the first resonator and that is in the second direction, and/or a length that is of the first acoustic wave suppression structure and that is in a second direction is greater than a length that is of the second resonator and that is in the second direction, where the first direction is perpendicular to the second direction. The length that is of the first acoustic wave suppression structure and that is in the second direction is greater than the length that is of the first resonator and that is in the second direction. In this case, it can be ensured that the first acoustic wave suppression structure can suppress, as far as possible, an acoustic wave that is leaked from the first resonator and that is propagated in the first direction, and it can be ensured that the first acoustic wave suppression structure can attenuate an acoustic wave leaked from the first resonator in an oblique direction. The length that is of the first acoustic wave suppression structure and that is in the second direction is greater than the length that is of the second resonator and that is in the second direction. In this case, it can be ensured that the first acoustic wave suppression structure can suppress, as far as possible, an acoustic wave that is leaked from the second resonator and that is propagated in the first direction, and it can be ensured that the first acoustic wave suppression structure can attenuate an acoustic wave leaked from the second resonator in the oblique direction.

In a possible implementation, a projection that is of the first acoustic wave suppression structure and that is in the first direction covers a projection that is of the first resonator and that is in the first direction, and/or a projection that is of the first acoustic wave suppression structure and that is in the first direction covers a projection that is of the second resonator and that is in the first direction. The projection that is of the first acoustic wave suppression structure and that is in the first direction covers the projection that is of the first resonator and that is in the first direction. This further ensures that the first acoustic wave suppression structure can suppress the acoustic wave that is leaked from the first resonator and that is propagated in the first direction, and ensures that a part that is outside the projection that is of the first resonator and that is in the first direction and that is of the projection that is of the first acoustic wave suppression structure and that is in the first direction can attenuate the acoustic wave leaked from the first resonator in the oblique direction. The projection that is of the first acoustic wave suppression structure and that is in the first direction covers the projection that is of the second resonator and that is in the first direction. This further ensures that the first acoustic wave suppression structure can suppress the acoustic wave that is leaked from the second resonator and that is propagated in the first direction, and ensures that a part that is outside the projection that is of the second resonator and that is in the first direction and that is of the projection that is of the first acoustic wave suppression structure and that is in the first direction can attenuate the acoustic wave leaked from the second resonator in the oblique direction.

In a possible implementation, the acoustic filter further includes a third resonator, the second resonator and the third resonator are arranged in the second direction, and the first direction is perpendicular to the second direction. The plurality of acoustic wave suppression units in the first acoustic wave suppression structure include a plurality of first acoustic wave suppression units and a plurality of second acoustic wave suppression units. The first acoustic wave suppression unit is close to the first resonator, and the second acoustic wave suppression unit is close to the second resonator. The first acoustic wave suppression unit and the second acoustic wave suppression unit are both configured to reduce an acoustic wave that is leaked from the first resonator and that enters the second resonator, or reduce an acoustic wave that is leaked from the second resonator and that enters the first resonator. The first acoustic wave suppression unit is further configured to reduce an acoustic wave that is leaked from the first resonator and that enters the third resonator, or reduce an acoustic wave that is leaked from the third resonator and that enters the first resonator. When the acoustic filter includes the third resonator, and the second resonator and the third resonator are arranged in the second direction, there may be an acoustic wave leaked in the oblique direction in the first resonator, and the acoustic wave leaked in the oblique direction may affect the third resonator. Alternatively, there may be an acoustic wave leaked in the oblique direction in the third resonator, and the acoustic wave leaked in the oblique direction may affect the first resonator. However, in this embodiment of this disclosure, the first acoustic wave suppression unit in the first acoustic wave suppression structure not only can reduce the acoustic wave that is leaked from the first resonator and that enters the second resonator, or reduce the acoustic wave that is leaked from the second resonator and that enters the first resonator, but also can reduce the acoustic wave that is leaked from the first resonator and that enters the third resonator, or reduce the acoustic wave that is leaked from the third resonator and that enters the first resonator such that the filtering performance of the acoustic filter can be improved.

In a possible implementation, the first acoustic wave suppression unit includes a first part and a second part, the second part is closer to the third resonator than the first part, a first end of the second part is connected to a first end of the first part, and the first part and the second part are not parallel. The first part can reduce the acoustic wave that is leaked from the first resonator and that enters the second resonator, or reduce the acoustic wave that is leaked from the second resonator and that enters the first resonator. The second part or an intersection position of the first part and the second part can reduce an acoustic wave that is leaked from the first resonator in the oblique direction and that enters the third resonator, or reduce an acoustic wave that is leaked from the third resonator in the oblique direction and that enters the first resonator.

In a possible implementation, an included angle between the first part and the second part ranges from 90 degrees (°) to 165°, and an opening of the included angle between the first part and the second part faces the first resonator. When the included angle between the first part and the second part ranges from 90° to 165°, the first acoustic wave suppression unit can more effectively reduce the acoustic wave that is leaked from the first resonator and that enters the second resonator, or reduce the acoustic wave that is leaked from the second resonator and that enters the first resonator, and reduce the acoustic wave that is leaked from the first resonator in the oblique direction and that enters the third resonator, or reduce the acoustic wave that is leaked from the third resonator in the oblique direction and that enters the first resonator.

In a possible implementation, in a same acoustic wave suppression unit group, a spacing between adjacent first parts is equal to a spacing between adjacent second parts. In the same acoustic wave suppression unit group, the spacing between the adjacent first parts is equal to the spacing between the adjacent second parts. Therefore, in the same acoustic wave suppression unit group, a stopband generated by a plurality of first parts is the same as a stopband generated by a plurality of second parts. In this case, acoustic waves that are of a same frequency band and that are leaked from the first resonator may be suppressed by the plurality of first parts when leaked in the first direction, and may be suppressed by the plurality of second parts when leaked in the oblique direction such that it is ensured that a stopband effect is basically the same in all directions, and a suppression effect of the first acoustic wave suppression unit is improved.

In a possible implementation, in the first direction, the first end of the first part is flush with the first resonator, or a projection that is of the first end of the first part and that is in the first direction is outside the first resonator. In the first acoustic wave suppression unit, the first part is mainly configured to suppress the acoustic wave that is leaked from the first resonator and that is propagated in the first direction, and the second part is mainly configured to suppress an acoustic wave that is leaked from the first resonator and that is propagated in the oblique direction. Therefore, when the first end of the first part is flush with the first resonator in the first direction, or the projection that is of the first end of the first part and that is in the first direction is outside the first resonator, it can be ensured that all acoustic waves that are leaked from the first resonator and that are propagated in the first direction can be suppressed by the first part.

In a possible implementation, the first acoustic wave suppression unit further includes a first connection part, the first connection part is disposed between the first part and the second part, one end of the first connection part is connected to the first end of the first part, and the other end is connected to the first end of the second part. The first connection part is configured such that a problem that is caused by a sharp angle due to a direct connection between the first part and the second part and that affects the filtering performance of the acoustic filter can be avoided. In addition, process difficulty in manufacturing the first acoustic wave suppression unit can be reduced.

In a possible implementation, the acoustic filter further includes a second acoustic wave suppression structure, the second acoustic wave suppression structure is disposed between the second resonator and the third resonator, and at least one stopband generated by the second acoustic wave suppression structure is used to reduce an acoustic wave that is leaked between the second resonator and the third resonator and that is propagated in the second direction. When the second acoustic wave suppression structure is designed, a specific frequency band of the acoustic filter may be covered by using the at least one stopband generated by the second acoustic wave suppression structure, to achieve an objective of reducing, by the at least one stopband generated by the second acoustic wave suppression structure, the acoustic wave that is leaked between the second resonator and the third resonator and that is propagated in the second direction, that is, reducing spur caused by the acoustic wave that is leaked between the second resonator and the third resonator and that is propagated in the second direction such as to reduce an acoustic wave that is leaked from the second resonator and propagated in the second direction and that enters the third resonator or prevent the acoustic wave that is leaked from the second resonator and propagated in the second direction from entering the third resonator, or reduce an acoustic wave that is leaked from the third resonator and propagated in the second direction and that enters the second resonator or prevent the acoustic wave that is leaked from the third resonator and propagated in the second direction from entering the second resonator such that the filtering performance of the acoustic filter is improved.

In a possible implementation, the acoustic filter further includes a fourth resonator, and the first resonator and the fourth resonator are arranged in the second direction. The second acoustic wave suppression unit is further configured to reduce an acoustic wave that is leaked from the second resonator and that enters the fourth resonator, or reduce an acoustic wave that is leaked from the fourth resonator and that enters the second resonator. When the acoustic filter further includes the fourth resonator, and the first resonator and the fourth resonator are arranged in the second direction, there may be an acoustic wave leaked in the oblique direction in the second resonator, and the acoustic wave leaked in the oblique direction may affect the fourth resonator. Alternatively, there may be an acoustic wave leaked in the oblique direction in the fourth resonator, and the acoustic wave leaked in the oblique direction may affect the second resonator. However, in this embodiment of this disclosure, the second acoustic wave suppression unit not only can reduce the acoustic wave that is leaked from the first resonator and that enters the second resonator, or reduce the acoustic wave that is leaked from the second resonator and that enters the first resonator, but also can reduce the acoustic wave that is leaked from the second resonator and that enters the fourth resonator, or reduce the acoustic wave that is leaked from the fourth resonator and that enters the second resonator such that the filtering performance of the acoustic filter can be improved.

In a possible implementation, the second acoustic wave suppression unit includes a third part and a fourth part, the fourth part is closer to the fourth resonator than the third part, a first end of the fourth part is connected to a first end of the third part, and the third part and the fourth part are not parallel. The third part can reduce the acoustic wave that is leaked from the first resonator and that enters the second resonator, or reduce the acoustic wave that is leaked from the second resonator and that enters the first resonator. The fourth part or an intersection position of the third part and the fourth part can reduce the acoustic wave that is leaked from the second resonator and that enters the fourth resonator, or reduce the acoustic wave that is leaked from the fourth resonator and that enters the second resonator.

In a possible implementation, an included angle between the third part and the fourth part ranges from 90° to 165°, and an opening of the included angle between the third part and the fourth part faces the second resonator. When the included angle between the third part and the fourth part ranges from 90° to 165°, the second acoustic wave suppression unit can more effectively reduce the acoustic wave that is leaked from the first resonator and that enters the second resonator, or reduce the acoustic wave that is leaked from the second resonator and that enters the first resonator, and reduce the acoustic wave that is leaked from the second resonator and that enters the fourth resonator, or reduce the acoustic wave that is leaked from the fourth resonator and that enters the second resonator.

In a possible implementation, in a same acoustic wave suppression unit group, a spacing between adjacent third parts is equal to a spacing between adjacent fourth parts. In the same acoustic wave suppression unit group, the spacing between the adjacent third parts is equal to the spacing between the adjacent fourth parts. Therefore, in the same acoustic wave suppression unit group, a stopband generated by a plurality of third parts is the same as a stopband generated by a plurality of fourth parts. In this case, acoustic waves that are of a same frequency band and that are leaked from the second resonator may be suppressed by the plurality of third parts when leaked in the first direction, and may be suppressed by the plurality of fourth parts when leaked in the oblique direction such that it is ensured that a stopband effect is basically the same in all directions, and a suppression effect of the second acoustic wave suppression unit is improved.

In a possible implementation, in the first direction, the first end of the third part is flush with the second resonator, or a projection that is of the first end of the third part and that is in the first direction is outside the second resonator. In the second acoustic wave suppression unit, the third part is mainly configured to suppress the acoustic wave that is leaked from the second resonator and that is propagated in the first direction, and the fourth part is mainly configured to suppress the acoustic wave that is leaked from the second resonator and that is propagated in the oblique direction. Therefore, when the first end of the third part is flush with the second resonator in the first direction, or the projection that is of the first end of the third part and that is in the first direction is outside the second resonator, it can be ensured that all acoustic waves that are leaked from the second resonator and that are propagated in the first direction can be suppressed by the third part.

In a possible implementation, the second acoustic wave suppression unit further includes a second connection part, the second connection part is disposed between the third part and the fourth part, one end of the second connection part is connected to the first end of the third part, and the other end of the second connection part is connected to the first end of the fourth part. The second connection part is configured such that a problem that is caused by a sharp angle due to a direct connection between the third part and the fourth part and that affects the filtering performance of the acoustic filter can be avoided. In addition, process difficulty in manufacturing the second acoustic wave suppression unit can be reduced.

In a possible implementation, the plurality of first acoustic wave suppression units and the plurality of second acoustic wave suppression units are symmetrically disposed with respect to an axis of symmetry extending in the second direction. It can be ensured that a suppression effect of the first acoustic wave suppression structure on an acoustic wave leaked from the first resonator is the same as a suppression effect of the first acoustic wave suppression structure on an acoustic wave leaked from the second resonator such that uniformity of the filtering performance of the acoustic filter can be improved.

In a possible implementation, the acoustic filter further includes a third acoustic wave suppression structure, the third acoustic wave suppression structure is disposed between the third resonator and the fourth resonator, and at least one stopband generated by the third acoustic wave suppression structure is used to reduce an acoustic wave that is leaked between the third resonator and the fourth resonator and that is propagated in the first direction. The acoustic filter further includes the third acoustic wave suppression structure disposed between the third resonator and the fourth resonator, and the at least one stopband generated by the third acoustic wave suppression structure is used to reduce the acoustic wave that is leaked between the third resonator and the fourth resonator and that is propagated in the first direction. In other words, the at least one stopband generated by the third acoustic wave suppression structure may attenuate an acoustic wave that is of a specific frequency band of the acoustic filter and that is leaked from the third resonator and the fourth resonator. In this case, an acoustic wave that is of the specific frequency band of the acoustic filter and that is leaked from the third resonator may be suppressed from entering the fourth resonator, or an acoustic wave that is of a specific frequency band of the acoustic filter and that is leaked from the fourth resonator may be suppressed from entering the third resonator such that the filtering performance of the acoustic filter is ensured.

In a possible implementation, the acoustic filter further includes a fourth acoustic wave suppression structure, the fourth acoustic wave suppression structure is disposed between the first resonator and the fourth resonator, and at least one stopband generated by the fourth acoustic wave suppression structure is used to reduce an acoustic wave that is leaked between the first resonator and the fourth resonator and that is propagated in the second direction. When the fourth acoustic wave suppression structure is designed, a specific frequency band of the acoustic filter may be covered by using the at least one stopband generated by the fourth acoustic wave suppression structure, to achieve an objective of reducing, by the at least one stopband generated by the fourth acoustic wave suppression structure, the acoustic wave that is leaked between the first resonator and the fourth resonator and that is propagated in the second direction such as to reduce an acoustic wave that is leaked from the first resonator and propagated in the second direction and that enters the fourth resonator or prevent the acoustic wave that is leaked from the first resonator and propagated in the second direction from entering the fourth resonator, or reduce an acoustic wave that is leaked from the fourth resonator and propagated in the second direction and that enters the first resonator or prevent the acoustic wave that is leaked from the fourth resonator and propagated in the second direction from entering the first resonator such that the filtering performance of the acoustic filter is improved.

In a possible implementation, the first resonator is a surface acoustic wave (SAW) resonator, and/or the second resonator is a SAW resonator. The SAW resonator includes an interdigital transducer (IDT), where the IDT includes a first busbar and a second busbar that are disposed opposite to each other, a plurality of first electrode fingers that are arranged in sequence in the first direction and that are in contact with the first busbar, and a plurality of second electrode fingers that are arranged in sequence in the first direction and that are in contact with the second busbar, where the first electrode finger and the second electrode finger are alternately arranged in sequence in the first direction.

In a possible implementation, the first resonator is a bulk acoustic wave (BAW) resonator, and/or the second resonator is a BAW resonator.

According to a second aspect, an acoustic filter is provided. The acoustic filter includes a first resonator, a second resonator, and a first acoustic wave suppression structure. The first resonator and the second resonator are arranged in a first direction, and an acoustic wave propagated in the first direction may be generated inside the first resonator, and/or an acoustic wave propagated in the first direction may be generated inside the second resonator. The first acoustic wave suppression structure is disposed between the first resonator and the second resonator, the first acoustic wave suppression structure includes at least one acoustic wave suppression unit group, each first acoustic wave suppression unit group in the at least one acoustic wave suppression unit group includes a plurality of acoustic wave suppression units, and the plurality of acoustic wave suppression units in the first acoustic wave suppression unit group are periodically arranged in the first direction. The first acoustic wave suppression structure is disposed between the first resonator and the second resonator of the acoustic filter, the first acoustic wave suppression structure includes the at least one acoustic wave suppression unit group, each first acoustic wave suppression unit group includes the plurality of acoustic wave suppression units, and the plurality of acoustic wave suppression units are arranged periodically in the first direction. Therefore, a spacing between the plurality of acoustic wave suppression units in the acoustic wave suppression unit group in the first direction is adjusted, to quickly and flexibly adjust a stopband generated by the acoustic wave suppression unit group such that the stopband generated by the plurality of acoustic wave suppression units that are periodically arranged in the first direction can be used to reduce an acoustic wave that is leaked between the first resonator and the second resonator and that is propagated in the first direction, and filtering performance of the acoustic filter is improved.

According to a third aspect, an electronic device is provided. The electronic device includes an acoustic filter, a processor, and a printed circuit board. Both the acoustic filter and the processor are disposed on the printed circuit board, and the acoustic filter is the acoustic filter provided in the first aspect. The electronic device has a same technical effect as the acoustic filter provided in the first aspect. For details, refer to related descriptions of the first aspect. Details are not described herein again.

Figures 1, 2:
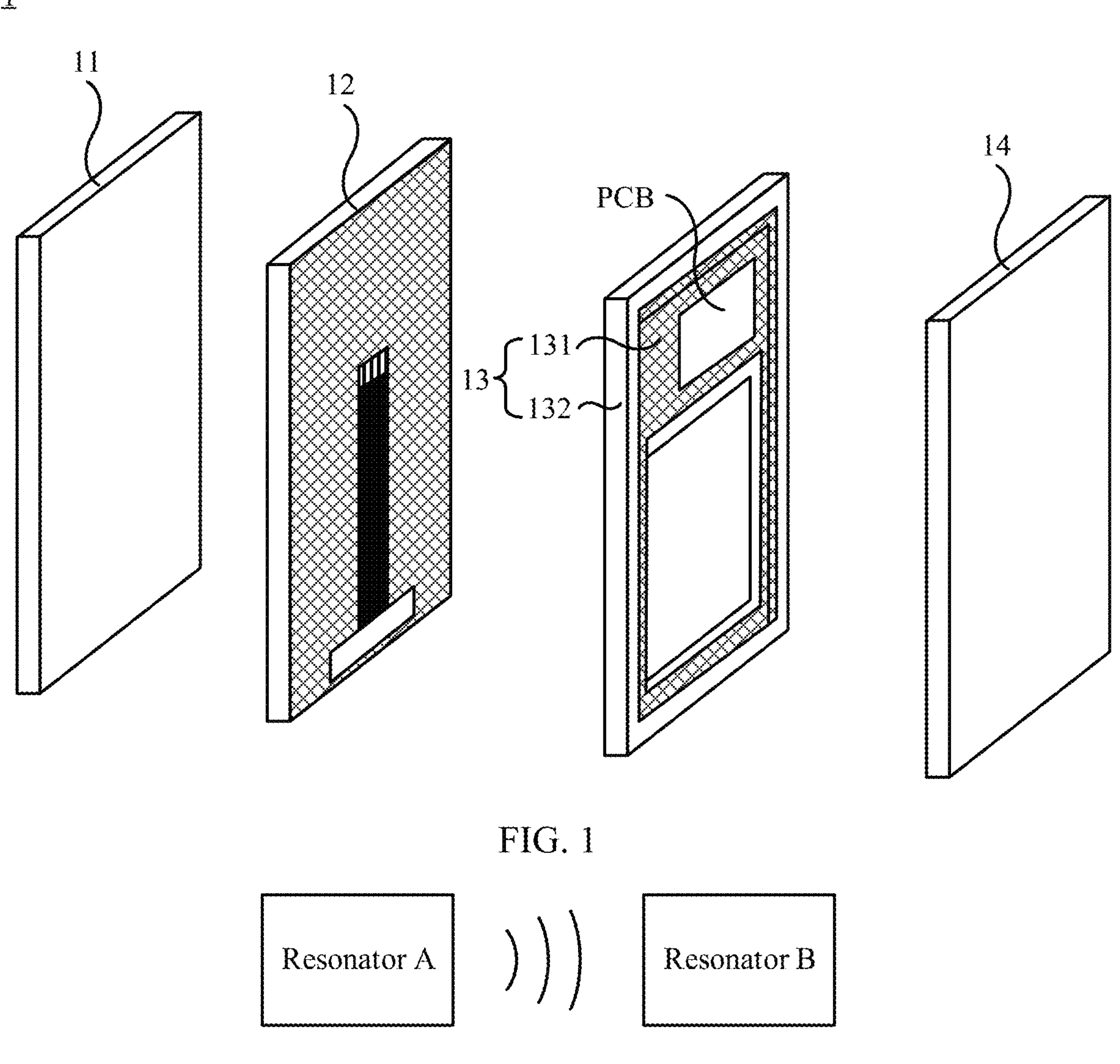
FIG. 1 is a diagram of a structure of an electronic device according to an embodiment of this disclosure.
FIG. 2 is a diagram of a structure of an acoustic filter.

1—Electronic device; 10—Acoustic filter; 11—Cover plate; 12—Display screen; 13—Middle frame; 14—Rear housing; 101—First resonator; 102—Second resonator; 103—First acoustic wave suppression structure; **103*a*—Acoustic wave suppression unit group; 104—Irregular pattern; 105—Third resonator; 106—Second acoustic wave suppression structure; 107—Fourth resonator; 108—Third acoustic wave suppression structure; 109—Fourth acoustic wave suppression structure; 131—Bearing plate; 132—Frame; 1011—IDT; 1012—Reflector; 1011*a*—First busbar; 1011*b*—Second busbar; 1011*c*—First Electrode finger; 1011*d*—Second electrode finger; 1012*a*—Grating; 1012*b*—Third busbar; 1031—Acoustic wave suppression unit; 1031*a*—First acoustic wave suppression unit; 1031*b*—Second acoustic wave suppression unit; 10311*a*—First part; 10312*a*—Second part; 10313*a*—First connection part; 10311*b*—Third part; 10312*b*—Fourth part; and 10313*b***—Second connection part.

DESCRIPTION OF EMBODIMENTS

The following describes the technical solutions in embodiments of this disclosure with reference to the accompanying drawings in embodiments of this disclosure. It is clear that the described embodiments are merely a part rather than all of embodiments of this disclosure.

The terms such as "first" and "second" mentioned below are merely for convenience of description, and shall not to be understood as an indication or implication of relative importance or implicit indication of a quantity of indicated technical features. Therefore, a feature limited by "first", "second", or the like may explicitly or implicitly include one or more features. In descriptions of this disclosure, unless otherwise stated, "a plurality of" means two or more than two.

In embodiments of this disclosure, the word such as "example" or "for example" is used to represent giving an example, an illustration, or a description. Any embodiment or design scheme described as an "example" or "for example" in embodiments of this disclosure should not be explained as being more preferred or having more advantages than another embodiment or design scheme. Exactly, use of the word such as "example" or "for example" is intended to present a relative concept in a specific manner.

In embodiments of this disclosure, "and/or" describes an association relationship between associated objects, and represents that three relationships may exist. For example, A and/or B may represent the following cases: only A exists, both A and B exist, and only B exists, where A and B may be singular or plural. The character "/" generally indicates an "or" relationship between the associated objects.

An embodiment of this disclosure provides an electronic device. The electronic device may be, for example, different types of user equipment or terminal devices such as a mobile phone, a tablet computer (or pad), a personal digital assistant (PDA), a television, an intelligent wearable product (for example, a smartwatch or a smart band), a virtual reality (VR) terminal device, an augmented reality (AR) terminal device, a small charging household appliance (for example, a soybean milk machine or a vacuum cleaning robot), an uncrewed aerial vehicle, a radar, an aerospace device, and a vehicle-mounted device. A specific form of the electronic device is not specially limited in this embodiment of this disclosure.

For ease of description, the following uses an example in which the electronic device is a mobile phone for description. As shown in FIG. 1, an electronic device 1 mainly includes a cover plate 11, a display screen 12, a middle frame 13, and a rear housing 14. The rear housing 14 and the display screen 12 are respectively located on two sides of the middle frame 13, the middle frame 13 and the display screen 12 are disposed in the rear housing 14, the cover plate 11 is disposed on a side that is of the display screen 12 and that is away from the middle frame 13, and a display surface of the display screen 12 faces the cover plate 11.

The display screen 12 may be a liquid-crystal display (LCD). In this case, the LCD includes a LCD panel and a backlight module. The LCD panel is disposed between the cover plate 11 and the backlight module, and the backlight module is configured to provide a light source for the LCD panel. Alternatively, the display screen 12 may be an organic light-emitting diode (LED) (OLED) display screen. Because the OLED display screen is a self-luminous display screen, a backlight module does not need to be disposed.

The middle frame 13 includes a bearing plate 131 and a frame 132 that surrounds the bearing plate 131. Electronic components such as a printed circuit board (PCB), a battery, and a camera in the electronic device 1 may be disposed on the bearing plate 131.

The electronic device 1 may further include a system-on-chip (SoC), a radio frequency chip, and the like that are disposed on the PCB. The PCB is configured to bear the system-on-chip, the radio frequency chip, and the like, and is electrically connected to the system-on-chip, the radio frequency chip, and the like. The radio frequency chip may include parts such as an acoustic filter and a processor. The processor is configured to process various signals. The acoustic filter is an important part of radio frequency signal processing, and is configured to block a signal at another frequency by using a signal at a specific frequency.

With integrated application of more frequency bands, filtering performance of the acoustic filter faces a greater challenge. Research has found that spurs affect the filtering performance. A structure of the acoustic filter mainly includes a plurality of resonators. Faced with a trend of increasing miniaturization of a chip, layout space needs to be fully used in an internal layout of the acoustic filter. Inevitably, as shown in FIG. 2, a layout manner in which two or more resonators are disposed on a same horizontal plane occurs. However, when an acoustic wave inside the resonator is horizontally propagated, a problem that an acoustic wave propagated inside one resonator is leaked and enters another resonator usually occurs. For example, as shown in FIG. 2, an acoustic wave propagated inside a resonator A is leaked and enters a resonator B. In this case, a spur between the acoustic wave that is leaked from the resonator A and that enters the resonator B and an acoustic wave generated inside the resonator B affects filtering performance of an entire acoustic filter. Therefore, it is necessary to find ways to suppress such leaked acoustic wave energy. However, it is further found that, in the acoustic filter, if the acoustic wave leaked between the resonator A and the resonator B is suppressed, the spur can be reduced such that the filtering performance of the acoustic filter can be improved.

In view of this, an embodiment of this disclosure provides an acoustic filter. The acoustic filter may be used in the foregoing electronic device 1. The acoustic filter provided in this embodiment of this disclosure may be, for example, a low-pass acoustic filter, a high-pass acoustic filter, a band-pass acoustic filter, a band-stop acoustic filter, or an active acoustic filter.

Figure 3A:
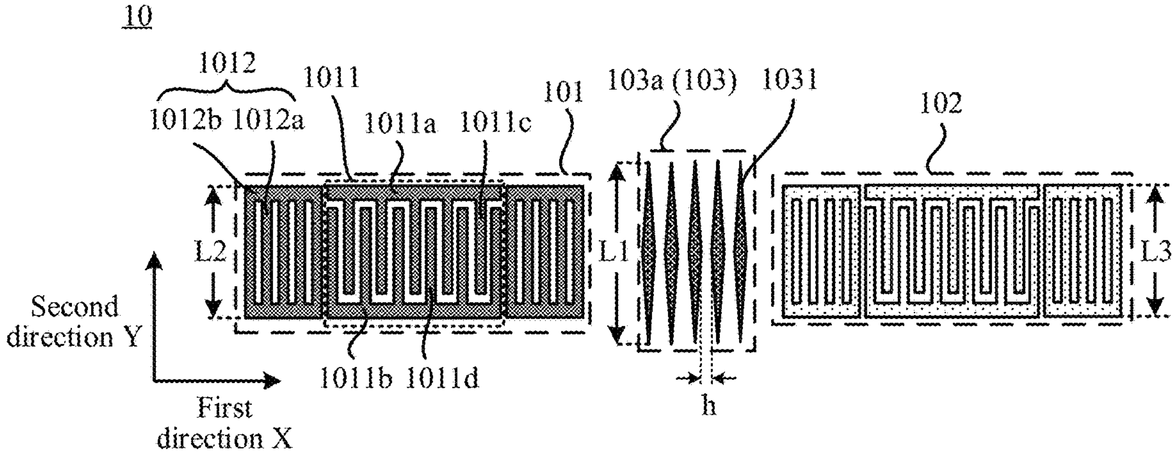
FIG. 3A is a diagram of a structure of an acoustic filter according to an embodiment of this disclosure.

As shown in FIG. 3A, an acoustic filter 10 provided in an embodiment of this disclosure includes a first resonator 101 and a second resonator 102. The first resonator 101 and the second resonator 102 are arranged in a first direction X. An acoustic wave propagated in the first direction X may be generated inside the first resonator 101, and/or an acoustic wave propagated in the first direction X may be generated inside the second resonator 102.

Herein, the first resonator 101 and the second resonator 102 may be, for example, SAW resonators or BAW resonators. In addition, a type of the first resonator 101 and a type of the second resonator 102 may be the same, for example, both are SAW resonators, or both are BAW resonators. Certainly, the type of the first resonator 101 and the type of the second resonator 102 may be different. For example, one of the first resonator 101 and the second resonator 102 is a SAW resonator, and the other is a BAW resonator.

For ease of description, in the accompanying drawings of the specification, an example in which both the first resonator 101 and the second resonator 102 are SAW resonators is used for illustration. When both the first resonator 101 and the second resonator 102 are SAW resonators, as shown in FIG. 3A, the SAW resonator includes an IDT 1011 disposed on a piezoelectric substrate or a piezoelectric thin film and reflectors 1012 disposed on two sides of the IDT 1011 in the first direction X. The IDT 1011 includes a first busbar 1011*a* and a second busbar 1011*b* that are disposed opposite to each other in a second direction, where the first direction is perpendicular to the second direction, and both the first busbar 1011*a* and the second busbar 1011*b* extend in the first direction X. The IDT 1011 further includes a plurality of first electrode fingers 1011*c* and a plurality of second electrode fingers 1011*d*. The plurality of first electrode fingers 1011*c* are arranged in sequence in the first direction X, and are electrically connected to the first busbar 1011*a*. The plurality of second electrode fingers 1011*d* are arranged in sequence in the first direction X, and are electrically connected to the second busbar 1011*b*. The first electrode finger 1011*c* and the second electrode finger 1011*d* are alternately disposed in the first direction X. The reflector 1012 may include a plurality of gratings 1012*a* arranged in sequence in the first direction X, and the plurality of gratings 1012*a* may be electrically connected together by using one or two third busbars 1012*b* extending in the first direction X.

An operating principle of the SAW resonator is as follows. An alternating electric field is loaded to the IDT 1011, and various SAWs may be generated through excitation on the piezoelectric substrate or along the piezoelectric thin film based on piezoelectric effect. Different types of acoustic waves have different frequencies and electromechanical coupling coefficients $k^2$. A type of the acoustic wave generated through excitation is determined by both an alternating frequency and a Euler angle of a piezoelectric material. The IDT 1011 has advantages such as a simple preparation process, high acoustic-electric conversion efficiency, and a flexible setting of an operating frequency.

That "an acoustic wave propagated in the first direction X may be generated inside the first resonator 101, and/or an acoustic wave propagated in the first direction X may be generated inside the second resonator 102" may mean that the acoustic wave propagated in the first direction X is generated inside the first resonator 101, and the acoustic wave propagated in the first direction X cannot be generated inside the second resonator 102, or may mean that the acoustic wave propagated in the first direction X is generated inside the second resonator 102, and the acoustic wave propagated in the first direction X cannot be generated inside the first resonator 101, or may certainly mean that the acoustic wave propagated in the first direction X is generated inside both the first resonator 101 and the second resonator 102. It may be understood that acoustic waves including but not limited to the acoustic wave propagated in the first direction X may be generated inside the first resonator 101 and the second resonator 102. An acoustic wave propagated in another direction may also be generated. For example, when the first resonator 101 and the second resonator 102 are BAW resonators, a BAW may also be generated inside the first resonator 101 and the second resonator 102.

Still refer to FIG. 3A. The acoustic filter 10 provided in this embodiment of this disclosure further includes a first acoustic wave suppression structure 103, the first acoustic wave suppression structure 103 is disposed between the first resonator 101 and the second resonator 102, and at least one stopband generated by the first acoustic wave suppression structure 103 is used to reduce an acoustic wave that is leaked between the first resonator 101 and the second resonator 102 and that is propagated in the first direction X, that is, reduce a spur caused by the acoustic wave that is leaked between the first resonator 101 and the second resonator 102 and that is propagated in the first direction X.

It should be understood that, in this embodiment of this disclosure, a reason why the at least one stopband generated by the first acoustic wave suppression structure 103 can be used to reduce the acoustic wave that is leaked between the first resonator 101 and the second resonator 102 and that is propagated in the first direction X is as follows. The at least one stopband generated by the first acoustic wave suppression structure 103 covers a specific frequency band of the acoustic filter 10, and the specific frequency band of the acoustic filter 10 is related to key performance specified by the acoustic filter 10, where the key performance may include, for example, out-of-band suppression. The key performance specified by the acoustic filter 10 may be related to one or more specific frequency bands of the acoustic filter 10. For any acoustic filter 10, key performance of the acoustic filter 10 may vary with a use scenario, a function, and the like of the acoustic filter 10. Therefore, a specific frequency band of the acoustic filter 10 should be selected as required. For example, the specific frequency band of the acoustic filter 10 may be 710 megahertz (MHz) to 750 MHz. For another example, the specific frequency band of the acoustic filter 10 may be 820 MHz to 840 MHz. When the acoustic filter 10 is designed, the stopband generated by the first acoustic wave suppression structure 103 is set based on the specific frequency band of the acoustic filter 10.

It may be understood that the first acoustic wave suppression structure 103 may generate one stopband for reducing the acoustic wave that is leaked between the first resonator 101 and the second resonator 102 and that is propagated in the first direction X. Alternatively, the first acoustic wave suppression structure 103 may generate a plurality of stopbands for reducing the acoustic wave that is leaked between the first resonator 101 and the second resonator 102 and that is propagated in the first direction X. In addition, there may be one or more specific frequency bands of the acoustic filter 10. The first acoustic wave suppression structure 103 may generate one stopband for covering the one or more specific frequency bands of the acoustic filter 10. Alternatively, the first acoustic wave suppression structure 103 may generate a plurality of stopbands for covering the one or more specific frequency bands of the acoustic filter 10.

It should be noted that, the stopband generated by the first acoustic wave suppression structure 103 is related to factors such as a material and a structure of the first acoustic wave suppression structure 103. Therefore, when the first acoustic wave suppression structure 103 is designed, the material, the structure, and the like of the first acoustic wave suppression structure 103 may be adjusted to adjust the stopband generated by the first acoustic wave suppression structure 103, or the material, the structure, and the like of the first acoustic wave suppression structure 103 may be adjusted to adjust the one or more stopbands generated by the first acoustic wave suppression structure 103.

It should be understood that the material of the first acoustic wave suppression structure 103 is a conductive material. In addition, the material of the first acoustic wave suppression structure 103 may be the same as or different from a material of an electrode in the first resonator 101 and a material of an electrode in the second resonator 102.

In this embodiment of this disclosure, considering that the first resonator 101 and the second resonator 102 are arranged in the first direction X, and the acoustic wave propagated in the first direction X may be generated inside the first resonator 101, and/or the acoustic wave propagated in the first direction X may be generated inside the second resonator 102, a case in which the acoustic wave propagated in the first direction X inside the first resonator 101 is leaked and enters the second resonator 102 may occur, or a case in which the acoustic wave propagated in the first direction X inside the second resonator 102 is leaked and enters the first resonator 101 may occur. As a result, filtering performance of the acoustic filter 10 is affected. Especially, with a trend of increasing miniaturization of a chip, layout space needs to be fully used in an internal layout of the filter. Therefore, a distance that is between the first resonator 101 and the second resonator 102 and that is in the first direction X is further reduced. As a result, the case in which the acoustic wave propagated in the first direction X inside the first resonator 101 is leaked and enters the second resonator 102 inevitably occurs, or the case in which the acoustic wave propagated in the first direction X inside the second resonator 102 is leaked and enters the first resonator 101 inevitably occurs. For the SAW resonator, the reflectors 1012 on the two sides of the IDT 1011 may constrain an acoustic wave within the IDT 1011. However, a constraint effect is related to many factors such as a quantity of pairs of reflectors 1012 and a periodicity of the reflector 1012, and a problem that the acoustic wave propagated in the first direction X inside the first resonator 101 or the acoustic wave propagated in the first direction X inside the second resonator 102 is leaked may still occur.

Based on the foregoing descriptions, in this embodiment of this disclosure, to avoid the case in which the acoustic wave propagated in the first direction X inside the first resonator 101 is leaked and enters the second resonator 102 or the case in which the acoustic wave propagated in the first direction X inside the second resonator 102 is leaked and enters the first resonator 101, the acoustic filter 10 provided in this embodiment of this disclosure further includes the first acoustic wave suppression structure 103 disposed between the first resonator 101 and the second resonator 102, and the at least one stopband generated by the first acoustic wave suppression structure 103 is used to reduce the acoustic wave that is leaked between the first resonator 101 and the second resonator 102 and that is propagated in the first direction X, that is, reduce the spur caused by the acoustic wave that is leaked between the first resonator 101 and the second resonator 102 and that is propagated in the first direction X, in other words, the at least one stopband generated by the first acoustic wave suppression structure 103 may be used to attenuate acoustic waves that are of the specific frequency band of the acoustic filter 10 and that are leaked from the first resonator 101 and the second resonator 102. In this case, the acoustic wave that is of the specific frequency band of the acoustic filter 10 and that is leaked from the first resonator 101 can be suppressed from entering the second resonator 102, or the acoustic wave that is of the specific frequency band of the acoustic filter 10 and that is leaked from the second resonator 102 can be suppressed from entering the first resonator 101 such that the filtering performance of the acoustic filter 10 can be improved.

Figure 4A:
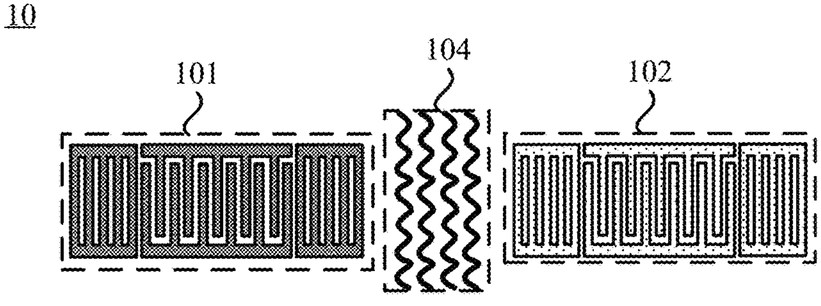
FIG. 4A is a diagram of a structure of an acoustic filter according to a related technology.

To avoid the case in which the acoustic wave propagated in the first direction X inside the first resonator 101 is leaked and enters the second resonator 102, or the case in which the acoustic wave propagated in the first direction X inside the second resonator 102 is leaked and enters the first resonator 101, a related technology provides an acoustic filter. As shown in FIG. 4A, in addition to the first resonator 101 and the second resonator 102, the acoustic filter 10 further includes an irregular pattern 104 disposed between the first resonator 101 and the second resonator 102. A cross-sectional shape of the irregular pattern 104 includes a wavy shape, a diamond shape, a square shape, a circle shape, or the like. Diffuse reflection of an acoustic wave signal is implemented by using the irregular pattern 104 such that an objective of suppressing an acoustic wave propagated inside the first resonator 101 from being leaked and entering the second resonator 102 or an acoustic wave propagated inside the second resonator 102 from being leaked and entering the first resonator 101 is achieved. However, an effect of suppressing, through diffuse reflection implemented by using the irregular pattern 104, a signal from being leaked is poor, and the leaked signal still affects the filtering performance of the acoustic filter 10. In comparison with the related technology, in this embodiment of this disclosure, the first acoustic wave suppression structure 103 is disposed between the first resonator 101 and the second resonator 102, and the at least one generated stopband is used to reduce the acoustic wave that is leaked between the first resonator 101 and the second resonator 102 and that is propagated in the first direction X, that is, reduce the spur caused by the acoustic wave that is leaked between the first resonator 101 and the second resonator 102 and that is propagated in the first direction X such that the acoustic waves that are of the specific frequency band of the acoustic filter 10 and that are leaked from the first resonator 101 and the second resonator 102 are attenuated. In this case, the acoustic wave that is of the specific frequency band of the acoustic filter 10 and that is leaked from the first resonator 101 can be suppressed from entering the second resonator 102, or the acoustic wave that is of the specific frequency band of the acoustic filter 10 and that is leaked from the second resonator 102 can be suppressed from entering the first resonator 101 such that a problem that an acoustic wave leaked from the first resonator 101 or an acoustic wave leaked from the second resonator 102 affects the filtering performance of the acoustic filter 10 can be relieved or avoided.

Figure 4B:
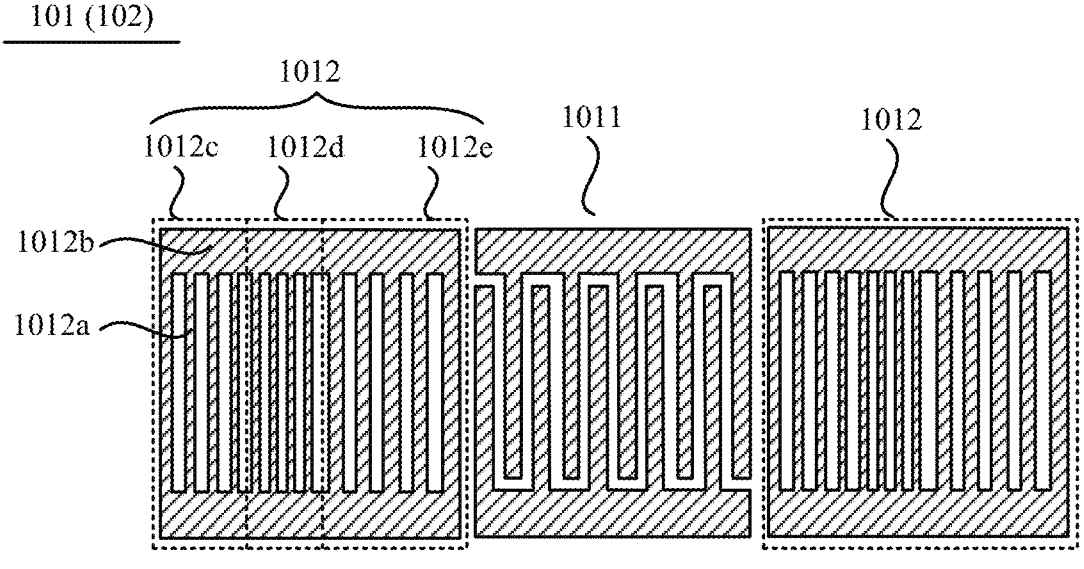
FIG. 4B is a diagram of a structure of an acoustic filter according to another related technology.

Another related technology provides an acoustic filter. A first resonator 101 and a second resonator 102 in the acoustic filter are SAW resonators. A principle of constraining a signal by using a reflector 1012 in the SAW resonator is a stopband effect. In a stopband frequency range, it may be considered that the reflector 1012 performs total reflection on an acoustic wave signal. Based on this, as shown in FIG. 4B, in the related technology, the reflector 1012 is divided into three parts: 1012*c*, 1012*d*, and 1012*e*. Each part has a different periodicity, to be specific, spacings between adjacent gratings 1012*a* of the three parts are different. In this case, the three parts may each generate one stopband. Therefore, the reflector 1012 can generate three stopbands. In comparison with other approaches in which spacings between reflectors 1012 are the same and the reflector 1012 can generate only one stopband, the related technology can extend a frequency range of the total reflection of the reflector 1012. However, a disadvantage of the related technology is that a frequency suppression range is limited, and it is possible that the acoustic wave of a specific frequency band of the acoustic filter 10 may be leaked. However, the specific frequency band of the acoustic filter 10 is related to key performance specified by the acoustic filter 10. Therefore, filtering performance of the acoustic filter 10 is still affected. In addition, a shape design of the reflector 1012 cannot be randomly adjusted. However, in this embodiment of this disclosure, the at least one stopband generated by the first acoustic wave suppression structure 103 is used to reduce the acoustic wave that is leaked between the first resonator 101 and the second resonator 102 and that is propagated in the first direction X, to reduce the spur caused by the acoustic wave that is leaked between the first resonator 101 and the second resonator 102 and that is propagated in the first direction X. Therefore, parameters such as a shape, the structure, and the material of the first acoustic wave suppression structure 103 may be randomly adjusted to adjust the stopband generated by the first acoustic wave suppression structure 103. The specific frequency band of the acoustic filter 10 is covered by using the at least one stopband generated by the first acoustic wave suppression structure 103 such that the acoustic wave that is of the specific frequency band of the acoustic filter 10 and that is leaked from the first resonator 101 and the second resonator 102 is attenuated. In this case, the acoustic wave that is of the specific frequency band of the acoustic filter 10 and that is leaked from the first resonator 101 can be suppressed from entering the second resonator 102, or the acoustic wave that is of the specific frequency band of the acoustic filter 10 and that is leaked from the second resonator 102 can be suppressed from entering the first resonator 101 such that the problem that the acoustic wave leaked from the first resonator 101 or the acoustic wave leaked from the second resonator 102 affects the filtering performance of the acoustic filter 10 can be relieved or avoided.

Figure 5:
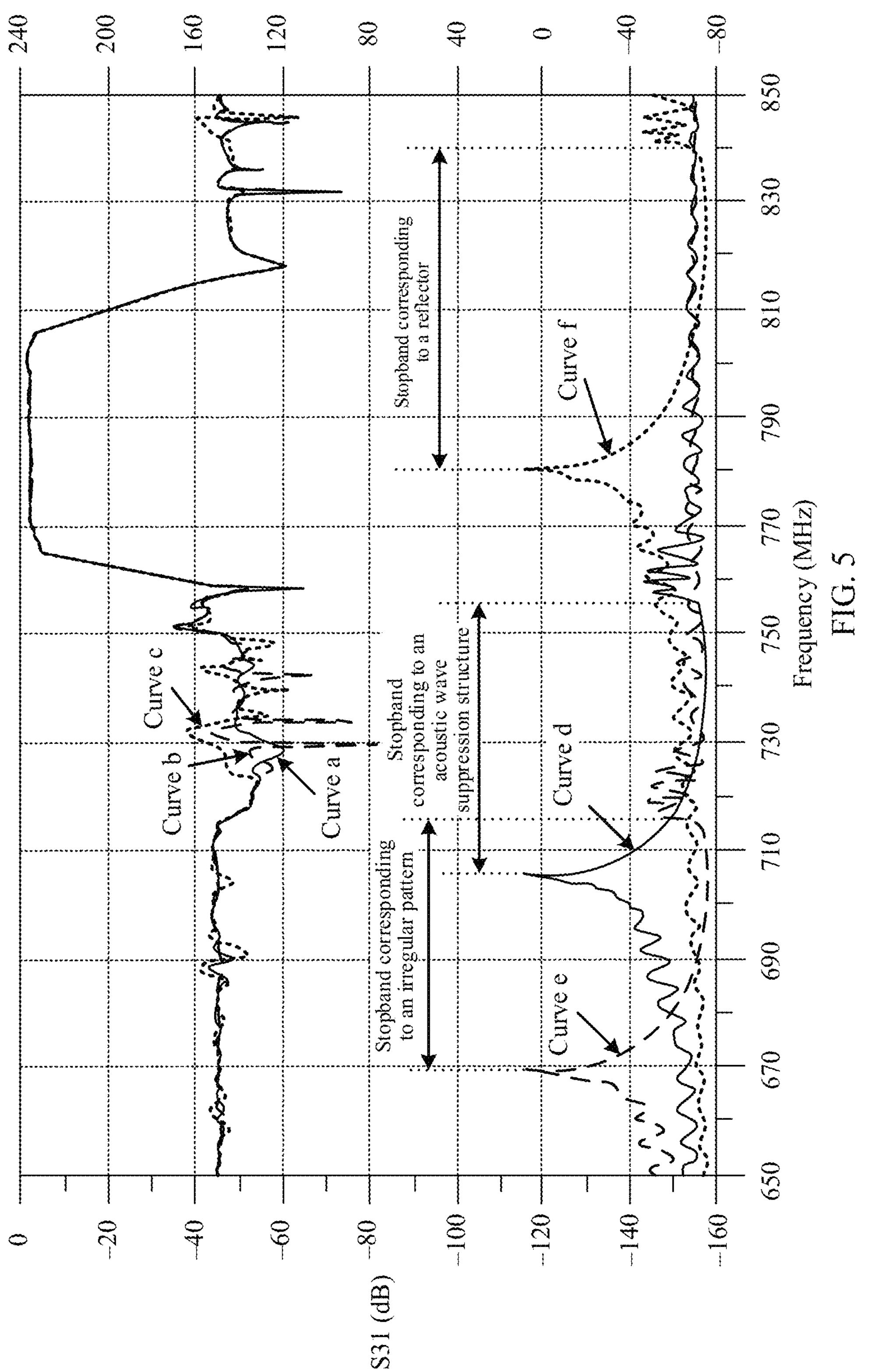
FIG. 5 is a curve diagram of a relationship between a frequency and a transmission function S31.

FIG. 5 is obtained through analog simulation. Refer to FIG. 5. A curve a in FIG. 5 is a curve of a relationship between a frequency of the acoustic filter 10 (where the first acoustic wave suppression structure 103 is disposed between the first resonator 101 and the second resonator 102) that is provided in this embodiment of this disclosure and that is shown in FIG. 3A and a transmission function S31. A curve b in FIG. 5 is a curve of a relationship between a frequency of the acoustic filter 10 (where the irregular pattern 104 is disposed between the first resonator 101 and the second resonator 102) that is provided in the related technology and that is shown in FIG. 4A and the transmission function S31. A curve c in FIG. 5 is a curve of a relationship between a frequency of the acoustic filter 10 in which no acoustic wave suppression structure is disposed between the first resonator 101 and the second resonator 102 and the transmission function S31. A curve d in FIG. 5 is a curve of a relationship between a frequency of the first acoustic wave suppression structure 103 in this embodiment of this disclosure and the transmission function S31, and the curve d indicates a stopband generated by the first acoustic wave suppression structure 103, where the stopband generated by the first acoustic wave suppression structure 103 is 705 MHz to 758 MHz. A curve e in FIG. 5 is a curve of a relationship between a frequency of the irregular pattern 104 in the related technology shown in FIG. 4A and the transmission function S31, and the curve e indicates a stopband generated by using the irregular pattern 104, where the stopband generated by using the irregular pattern 104 is 670 MHz to 718 MHz. A curve f in FIG. 5 is a curve of a relationship between a frequency of a reflector in a SAW resonator and the transmission function S31, and the curve f indicates a stopband generated by the reflector, where the stopband generated by the reflector is 780 MHz to 840 MHz. It should be noted that, in an analog simulation process, a periodicity of the irregular pattern 104 in FIG. 4A is 1.06 times a periodicity of the first acoustic wave suppression structure 103 in FIG. 3A. During actual manufacturing, the periodicity of the irregular pattern 104 is far greater than the periodicity of the first acoustic wave suppression structure 103 in FIG. 3A. In addition, in FIG. 5, left vertical coordinates are vertical coordinates of the curve a, the curve b, and the curve c, and right vertical coordinates are vertical coordinates of the curve d, the curve e, and the curve f.

It can be learned from the curve a, the curve b, and the curve c in FIG. 5 that a frequency band of a passband of the acoustic filter 10 is 760 MHz to 815 MHz. In FIG. 5, an example in which a left side of the passband of the acoustic filter 10 is a key performance position of the acoustic filter 10, in other words, the specific frequency band of the acoustic filter 10 is 718 MHz to 750 MHz, is used. It can be learned through comparison between the curve a, the curve b, and the curve c that, in the frequency band from 718 MHz to 750 MHz, on the curve a, the transmission function S31 of the acoustic filter 10 provided in this embodiment of this disclosure is less than −50 dB. However, on the curve b and the curve c, a case in which the transmission function S31 of the acoustic filter 10 is greater than −50 dB exists. This indicates that the stopband generated by the first acoustic wave suppression structure 103 in the acoustic filter 10 provided in this embodiment of this disclosure can reduce the acoustic wave that is leaked between the first resonator 101 and the second resonator 102 and that is propagated in the first direction X, that is, reduce the spur caused by the acoustic wave that is leaked between the first resonator 101 and the second resonator 102 and that is propagated in the first direction X. It can be learned from the curve d that, the stopband generated by the first acoustic wave suppression structure 103 in the acoustic filter 10 provided in this embodiment of this disclosure is 705 MHz to 758 MHz, and the stopband generated by the first acoustic wave suppression structure 103 covers the specific frequency band of the acoustic filter 10. Therefore, the first acoustic wave suppression structure 103 in this embodiment of this disclosure can effectively reduce the acoustic wave that is leaked between the first resonator 101 and the second resonator 102 and that is propagated in the first direction X, that is, reduce the spur caused by the acoustic wave that is leaked between the first resonator 101 and the second resonator 102 and that is propagated in the first direction X such that the out-of-band suppression can reach 50 dB. It can be learned from the curve e that, the stopband generated by using the irregular pattern 104 is 670 MHz to 718 MHz, and the stopband generated by using the irregular pattern 104 does not cover the specific frequency band of the acoustic filter 10. Therefore, an effect of reducing, through diffuse reflection implemented by using the irregular pattern 104, the spur caused by the acoustic wave that is leaked between the first resonator 101 and the second resonator 102 and that is propagated in the first direction X is poor. It can be learned from the curve f that, for the SAW resonator, a stopband generated by a reflector is 780 MHz to 840 MHz. In this case, the reflector can suppress only acoustic waves whose frequency band is 780 MHz to 840 MHz, and when the specific frequency band of the acoustic filter 10 is not in a range of 780 MHz to 840 MHz, for example, as shown in FIG. 5, when the specific frequency band of the acoustic filter 10 is 718 MHz to 750 MHz, the acoustic wave leaked between the first resonator 101 and the second resonator 102 still causes the spur. However, in this embodiment of this disclosure, the at least one stopband generated by the first acoustic wave suppression structure 103 is used to reduce the acoustic wave that is leaked between the first resonator 101 and the second resonator 102 and that is propagated in the first direction X, that is, reduce the spur caused by the acoustic wave that is leaked between the first resonator 101 and the second resonator 102 and that is propagated in the first direction X. Therefore, when the first acoustic wave suppression structure 103 is designed, the at least one stopband generated by the first acoustic wave suppression structure 103 can cover the specific frequency band of the acoustic filter 10 such that an objective that the at least one stopband generated by the first acoustic wave suppression structure 103 is used to reduce the acoustic wave that is leaked between the first resonator 101 and the second resonator 102 and that is propagated in the first direction X, that is, reduce the spur caused by the acoustic wave that is leaked between the first resonator 101 and the second resonator 102 and that is propagated in the first direction X, is achieved.

It should be noted that a specific structure of the first acoustic wave suppression structure 103 is not limited in this disclosure, provided that the at least one stopband generated by the first acoustic wave suppression structure 103 can be used to reduce the acoustic wave that is leaked between the first resonator 101 and the second resonator 102 and that is propagated in the first direction X.

In some examples, as shown in FIG. 3A, the first acoustic wave suppression structure 103 includes at least one acoustic wave suppression unit group 103*a*, and each first acoustic wave suppression unit group 103*a* in the at least one acoustic wave suppression unit group 103*a* includes a plurality of acoustic wave suppression units 1031. The plurality of acoustic wave suppression units 1031 in the acoustic wave suppression unit group 103*a* are arranged in sequence in the first direction X at a same spacing h, that is, the plurality of acoustic wave suppression units 1031 in the acoustic wave suppression unit group 103*a* are periodically arranged in the first direction X.

Figure 3B:
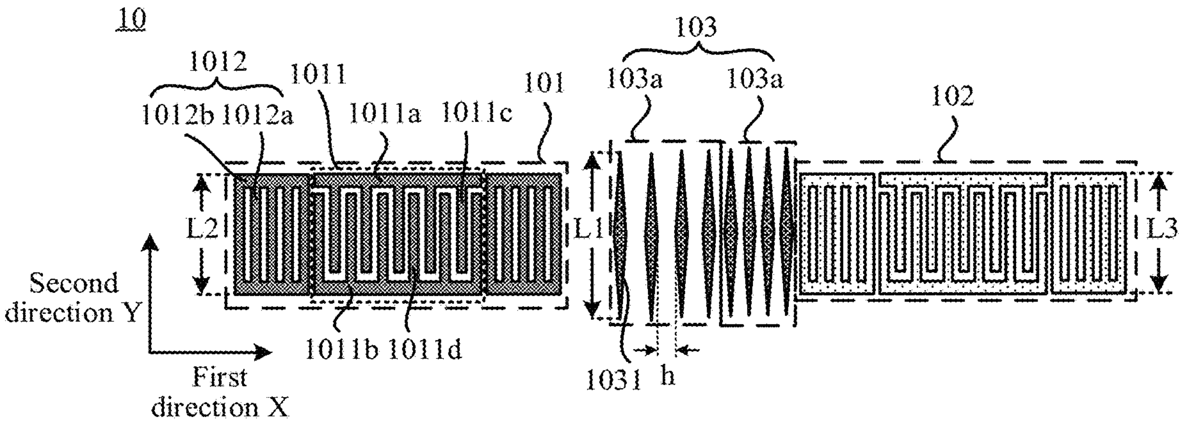
FIG. 3B is a diagram of a structure of an acoustic filter according to another embodiment of this disclosure.

Herein, the first acoustic wave suppression structure 103 may include one acoustic wave suppression unit group 103*a*, as shown in FIG. 3A. The first acoustic wave suppression structure 103 may alternatively include a plurality of acoustic wave suppression unit groups 103*a*, as shown in FIG. 3B. In FIG. 3B, an example in which the first acoustic wave suppression structure 103 includes two acoustic wave suppression unit groups 103*a* is used for illustration. For ease of description, the following uses an example in which the first acoustic wave suppression structure 103 includes one acoustic wave suppression unit group 103*a*.

When the first acoustic wave suppression structure 103 includes a plurality of acoustic wave suppression unit groups 103*a*, that is, the at least one acoustic wave suppression unit group includes a plurality of acoustic wave suppression unit groups 103*a*, spacings h between two adjacent acoustic wave suppression units 1031 in different acoustic wave suppression unit groups 103*a* are different.

It may be understood that, for each acoustic wave suppression unit group 103*a*, a material of the acoustic wave suppression unit 1031 in the acoustic wave suppression unit group 103*a*, the spacing h at which the plurality of acoustic wave suppression units 1031 in the acoustic wave suppression unit group 103*a* are arranged in the first direction X, and the like may be adjusted to adjust a stopband generated by the acoustic wave suppression unit group 103*a*. In the acoustic wave suppression unit group 103*a*, the spacing h between two adjacent acoustic wave suppression units 1031 affects the stopband generated by the acoustic wave suppression unit group 103*a*. The spacings h between two adjacent acoustic wave suppression units 1031 in different acoustic wave suppression unit groups 103*a* are different. Therefore, when the material of the acoustic wave suppression unit 1031 is determined, different acoustic wave suppression unit groups 103*a* correspondingly generate different stopbands such that the first acoustic wave suppression structure 103 can generate a plurality of stopbands. If the first acoustic wave suppression structure 103 includes one acoustic wave suppression unit group 103*a*, the first acoustic wave suppression structure 103 correspondingly generates one stopband. If the first acoustic wave suppression structure 103 includes a plurality of acoustic wave suppression unit groups 103*a*, the first acoustic wave suppression structure 103 correspondingly generates a plurality of stopbands.

Herein, a quantity of the plurality of acoustic wave suppression units 1031 in the acoustic wave suppression unit group 103*a* may be set as required. It may be understood that the specified quantity of acoustic wave suppression units 1031 should ensure that a leaked acoustic wave can be attenuated enough.

Figure 6A:
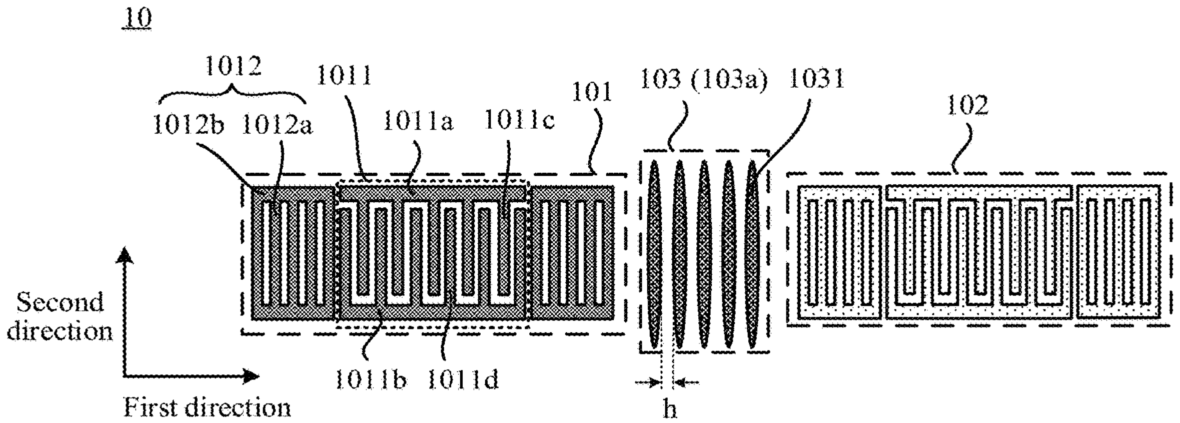
FIG. 6A is a diagram of a structure of an acoustic filter according to still another embodiment of this disclosure.
Figure 6B:
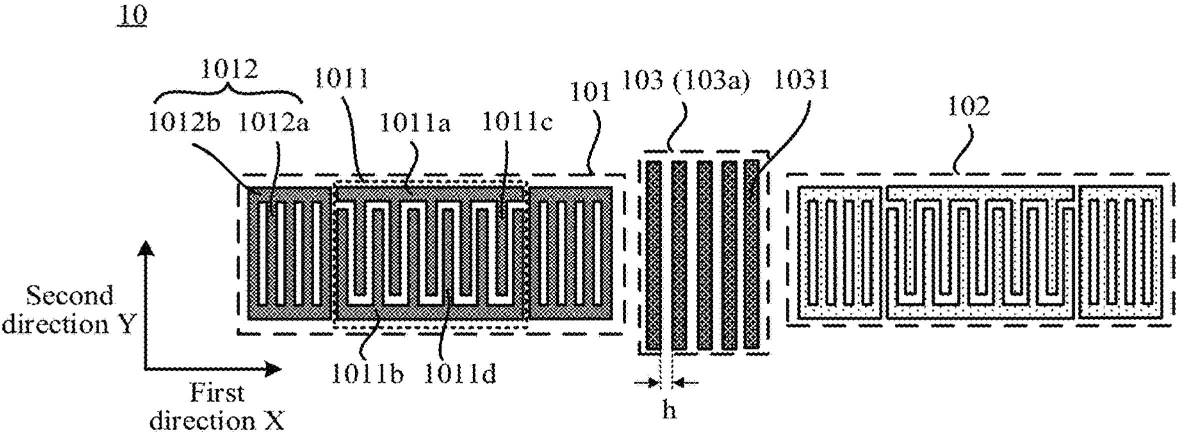
FIG. 6B is a diagram of a structure of an acoustic filter according to still another embodiment of this disclosure.
Figure 6C:
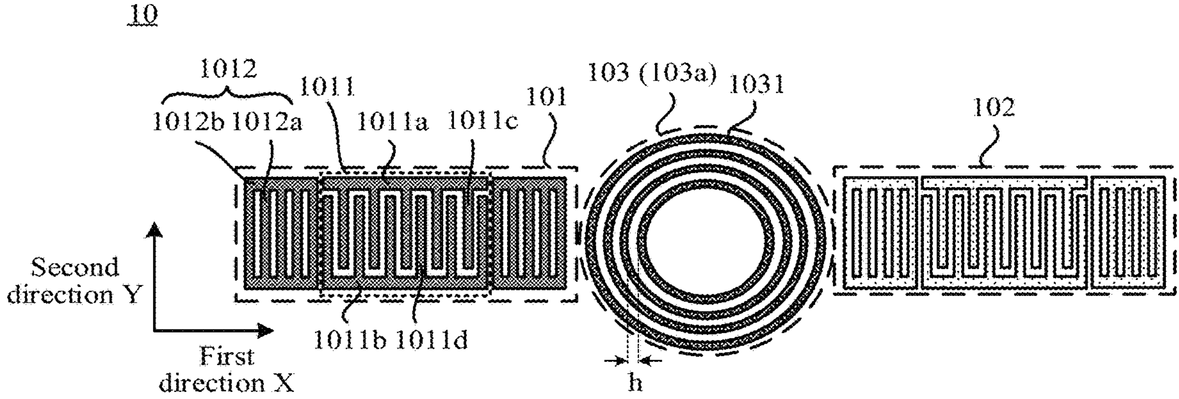
FIG. 6C is a diagram of a structure of an acoustic filter according to still another embodiment of this disclosure.

In addition, a cross-sectional shape of the acoustic wave suppression unit 1031 may be, for example, a diamond shape shown in FIG. 3A. For another example, a cross-sectional shape of the acoustic wave suppression unit 1031 may be an oval shape shown in FIG. 6A. For another example, a cross-sectional shape of the acoustic wave suppression unit 1031 may be a square shape shown in FIG. 6B. For another example, a cross-sectional shape of the acoustic wave suppression unit 1031 may be a ring shape shown in FIG. 6C, for example, a circular ring shape or a square ring shape, and a plurality of acoustic wave suppression units 1031 may be sleeved together in sequence.

It should be noted that the acoustic filter 10 is usually manufactured on a substrate, and the cross-sectional shape of the acoustic wave suppression unit 1031 refers to a shape of a cross section of the acoustic wave suppression unit 1031 parallel to the substrate.

It should be understood that the cross-sectional shape of the acoustic wave suppression unit 1031 includes but is not limited to the diamond shape, the square shape, the oval shape, or the circular ring shape, or may be another regular or irregular shape. In addition, shapes of the plurality of acoustic wave suppression units 1031 may be the same, or may be different.

When the acoustic wave suppression unit group 103*a* includes a plurality of acoustic wave suppression units 1031, and the plurality of acoustic wave suppression units 1031 in the acoustic wave suppression unit group 103*a* are arranged in sequence in the first direction X at a same spacing h, that is, the plurality of acoustic wave suppression units 1031 in the acoustic wave suppression unit group 103*a* are periodically arranged in the first direction X, the spacing h at which the plurality of acoustic wave suppression units 1031 in the acoustic wave suppression unit group 103*a* are arranged in the first direction X may be adjusted to quickly and flexibly adjust the stopband generated by the acoustic wave suppression unit group 103*a* such that the at least one stopband generated by the first acoustic wave suppression structure 103 can be used to reduce the acoustic wave that is leaked between the first resonator 101 and the second resonator 102 and that is propagated in the first direction X.

In some other examples, the acoustic wave suppression unit group 103*a* includes a plurality of acoustic wave suppression units 1031, and the plurality of acoustic wave suppression units 1031 in the acoustic wave suppression unit group 103*a* may be arranged in sequence in the first direction X at spacings h that are not exactly the same, that is, the plurality of acoustic wave suppression units 1031 in the acoustic wave suppression unit group 103*a* are not periodically arranged in the first direction X.

Based on this, to ensure that the first acoustic wave suppression structure 103 can suppress, as far as possible, an acoustic wave that is leaked from the first resonator 101 and that is propagated in the first direction X, and ensure that the first acoustic wave suppression structure 103 can attenuate an acoustic wave leaked from the first resonator 101 in an oblique direction, as shown in FIG. 3A, a length L1 that is of the first acoustic wave suppression structure 103 and that is in a second direction Y is greater than a length L2 that is of the first resonator 101 and that is in the second direction Y, where the first direction X is perpendicular to the second direction Y. When the acoustic wave suppression unit group 103*a* in the first acoustic wave suppression structure 103 includes a plurality of acoustic wave suppression units 1031, a length L1 that is of the acoustic wave suppression unit 1031 and that is in the second direction Y is greater than the length L2 that is of the first resonator 101 and that is in the second direction Y. Similarly, to ensure that the first acoustic wave suppression structure 103 can suppress, as far as possible, an acoustic wave that is leaked from the second resonator 102 and that is propagated in the first direction X, and ensure that the first acoustic wave suppression structure 103 can attenuate an acoustic wave leaked from the second resonator 102 in the oblique direction, as shown in FIG. 3A, the length L1 that is of the first acoustic wave suppression structure 103 and that is in the second direction Y is greater than a length L3 that is of the second resonator 102 and that is in the second direction Y. When the acoustic wave suppression unit group 103*a* in the first acoustic wave suppression structure 103 includes a plurality of acoustic wave suppression units 1031, a length L1 that is of the acoustic wave suppression unit 1031 and that is in the second direction Y is greater than the length L3 that is of the second resonator 102 and that is in the second direction Y.

On the basis that the length L1 that is of the first acoustic wave suppression structure 103 and that is in the second direction Y is greater than the length L2 that is of the first resonator 101 and that is in the second direction Y, when the first acoustic wave suppression structure 103 is designed, in some examples, a projection that is of the first acoustic wave suppression structure 103 and that is in the first direction X covers a projection that is of the first resonator 101 and that is in the first direction X, in other words, two boundaries that are of the first acoustic wave suppression structure 103 and that are in the second direction Y are outside a boundary that is of the first resonator 101 and that is in the second direction Y. When the acoustic wave suppression unit group 103*a* in the first acoustic wave suppression structure 103 includes a plurality of acoustic wave suppression units 1031, a projection that is of the acoustic wave suppression unit 1031 and that is in the first direction X covers the projection that is of the first resonator 101 and that is in the first direction X, in other words, two boundaries that are of the acoustic wave suppression unit 1031 and that are in the second direction Y are outside the boundary that is of the first resonator 101 and that is in the second direction Y. This further ensures that the first acoustic wave suppression structure 103 can suppress the acoustic wave that is leaked from the first resonator 101 and that is propagated in the first direction X, and ensures that a part, of the projection that is of the first acoustic wave suppression structure 103 and that is in the first direction X, outside the projection that is of the first resonator 101 and that is in the first direction X can attenuate the acoustic wave leaked from the first resonator 101 in the oblique direction. In some other examples, the projection that is of the first acoustic wave suppression structure 103 and that is in the first direction X covers a part of the projection that is of the first resonator 101 and that is in the first direction X. When the acoustic wave suppression unit group 103*a* in the first acoustic wave suppression structure 103 includes a plurality of acoustic wave suppression units 1031, a projection that is of the acoustic wave suppression unit 1031 and that is in the first direction X covers a part of the projection that is of the first resonator 101 and that is in the first direction X.

Similarly, on the basis that the length L1 that is of the first acoustic wave suppression structure 103 and that is in the second direction Y is greater than the length L3 that is of the second resonator 102 and that is in the second direction Y, when the first acoustic wave suppression structure 103 is designed, in some examples, the projection that is of the first acoustic wave suppression structure 103 and that is in the first direction X covers a projection that is of the second resonator 102 and that is in the first direction X, in other words, the two boundaries that are of the first acoustic wave suppression structure 103 and that are in the second direction Y are outside a boundary that is of the second resonator 102 and that is in the second direction Y. When the acoustic wave suppression unit group 103*a* in the first acoustic wave suppression structure 103 includes a plurality of acoustic wave suppression units 1031, a projection that is of the acoustic wave suppression unit 1031 and that is in the first direction X covers the projection that is of the second resonator 102 and that is in the first direction X, in other words, two boundaries that are of the acoustic wave suppression unit 1031 and that are in the second direction Y are outside the boundary that is of the second resonator 102 and that is in the second direction Y. This further ensures that the first acoustic wave suppression structure 103 can suppress the acoustic wave that is leaked from the second resonator 102 and that is propagated in the first direction X, and ensures that a part, of the projection that is of the first acoustic wave suppression structure 103 and that is in the first direction X, outside the projection that is of the second resonator 102 and that is in the first direction X can attenuate the acoustic wave leaked from the second resonator 102 in the oblique direction. In some other examples, the projection that is of the first acoustic wave suppression structure 103 and that is in the first direction X covers a part of the projection that is of the second resonator 102 and that is in the first direction X. When the acoustic wave suppression unit group 103*a* in the first acoustic wave suppression structure 103 includes a plurality of acoustic wave suppression units 1031, a projection that is of the acoustic wave suppression unit 1031 and that is in the first direction X covers a part of the projection that is of the second resonator 102 and that is in the first direction X.

Figure 7:
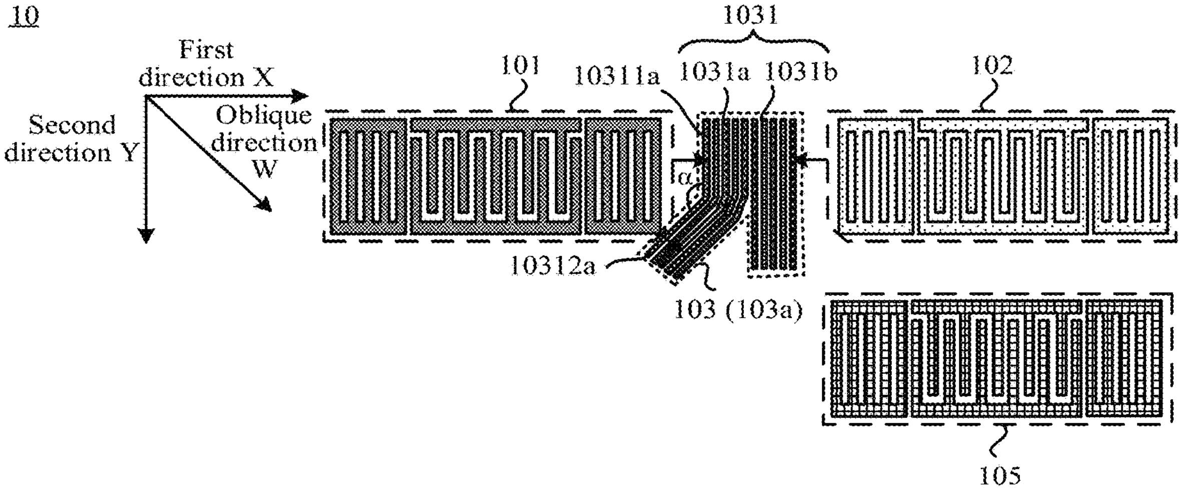
FIG. 7 is a diagram of a structure of an acoustic filter according to still another embodiment of this disclosure.

It may be understood that, in addition to the first resonator 101 and the second resonator 102, as shown in FIG. 7, the acoustic filter 10 may further include a third resonator 105. For a structure and a type of the third resonator 105, refer to the first resonator 101. Details are not described herein again. The second resonator 102 and the third resonator 105 are arranged in the second direction Y, where the first direction X is perpendicular to the second direction Y. In this case, in some examples, as shown in FIG. 7, the plurality of acoustic wave suppression units 1031 in the first acoustic wave suppression structure 103 include a plurality of first acoustic wave suppression units 1031*a* and a plurality of second acoustic wave suppression units 1031*b*. The first acoustic wave suppression unit 1031*a* is close to the first resonator 101, and the second acoustic wave suppression unit 1031*b* is close to the second resonator 102. The first acoustic wave suppression unit 1031*a* is configured to reduce an acoustic wave that is leaked from the first resonator 101 and that enters the second resonator 102, or configured to reduce an acoustic wave that is leaked from the second resonator 102 and that enters the first resonator 101. The first acoustic wave suppression unit 1031*a* is further configured to reduce an acoustic wave that is leaked from the first resonator 101 and that enters the third resonator 105, or reduce an acoustic wave that is leaked from the third resonator 105 and that enters the first resonator 101. The second acoustic wave suppression unit 1031*b* is configured to reduce an acoustic wave that is leaked from the first resonator 101 and that enters the second resonator 102, or configured to reduce an acoustic wave that is leaked from the second resonator 102 and that enters the first resonator 101.

"The plurality of acoustic wave suppression units 1031 in the first acoustic wave suppression structure 103" above refers to a plurality of acoustic wave suppression units 1031 in all acoustic wave suppression unit groups 103*a*.

It should be noted that the plurality of first acoustic wave suppression units 1031*a* may belong to one acoustic wave suppression unit group 103*a*, or may belong to a plurality of acoustic wave suppression unit groups 103*a*. Similarly, the plurality of second acoustic wave suppression units 1031*b* may belong to one acoustic wave suppression unit group 103*a*, or may belong to a plurality of acoustic wave suppression unit groups 103*a*.

Refer to FIG. 7. When the acoustic filter 10 includes the third resonator 105, and the second resonator 102 and the third resonator 105 are arranged in the second direction Y, there may be an acoustic wave leaked in the oblique direction in the first resonator 101, and the acoustic wave leaked in the oblique direction may affect the third resonator 105. Alternatively, there may be an acoustic wave leaked in the oblique direction in the third resonator 105, and the acoustic wave leaked in the oblique direction may affect the first resonator 101. However, in this embodiment of this disclosure, the first acoustic wave suppression unit 1031*a* in the first acoustic wave suppression structure 103 not only can reduce the acoustic wave that is leaked from the first resonator 101 and that enters the second resonator 102, or reduce the acoustic wave that is leaked from the second resonator 102 and that enters the first resonator 101, but also can reduce the acoustic wave that is leaked from the first resonator 101 and that enters the third resonator 105, or reduce the acoustic wave that is leaked from the third resonator 105 and that enters the first resonator 101 such that the filtering performance of the acoustic filter 10 can be improved.

A structure of the first acoustic wave suppression unit 1031*a* is not limited in this embodiment of this disclosure, provided that the first acoustic wave suppression unit 1031*a* not only can reduce the acoustic wave that is leaked from the first resonator 101 and that enters the second resonator 102, or reduce the acoustic wave that is leaked from the second resonator 102 and that enters the first resonator 101, but also can reduce the acoustic wave that is leaked from the first resonator 101 and that enters the third resonator 105, or reduce the acoustic wave that is leaked from the third resonator 105 and that enters the first resonator 101. In some examples, as shown in FIG. 7, the first acoustic wave suppression unit 1031*a* includes a first part 10311*a* and a second part 10312*a*, the second part 10312*a* is closer to the third resonator 105 than the first part 10311*a*, a first end of the second part 10312*a* is connected to a first end of the first part 10311*a*, and the first part 10311*a* and the second part 10312*a* are not parallel.

The first part 10311*a* is located between the first resonator 101 and the second resonator 102, and the first part 10311*a* may extend in the second direction Y, where the second direction Y is perpendicular to the first direction X.

It may be understood that the first part 10311*a* and the second part 10312*a* may be an integrated structure, in other words, the first part 10311*a* and the second part 10312*a* may be simultaneously manufactured through an integrated process. Alternatively, the first part 10311*a* and the second part

10312$a$ may be two independent structures, in other words, the first part 10311$a$ and the second part 10312$a$ may be separately formed through two processes.

In addition, a material of the first part 10311$a$ and a material of the second part 10312$a$ may be the same, or may be different.

Figure 8:
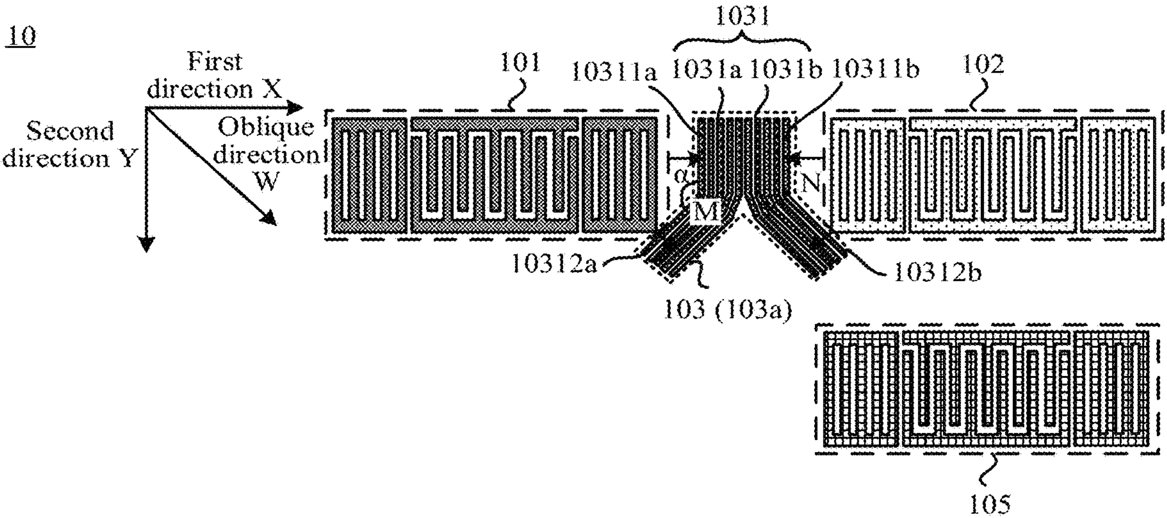
FIG. 8 is a diagram of a structure of an acoustic filter according to still another embodiment of this disclosure.

Based on this, when the acoustic filter 10 includes the third resonator 105, and the first acoustic wave suppression unit 1031$a$ includes the first part 10311$a$ and the second part 10312$a$, for the second acoustic wave suppression unit 1031$b$, for example, as shown in FIG. 7, the second acoustic wave suppression unit 1031$b$ may include only a part extending in the second direction Y. For another example, as shown in FIG. 8, the second acoustic wave suppression unit 1031$b$ may include a third part 10311$b$ and a fourth part 10312$b$, the fourth part 10312$b$ is closer to the third resonator 105 than the third part 10311$b$, a first end of the fourth part 10312$b$ is connected to a first end of the third part 10311$b$, and the third part 10311$b$ and the fourth part 10312$b$ are not parallel.

When the first acoustic wave suppression unit 1031$a$ includes the first part 10311$a$ and the second part 10312$a$, the first part 10311$a$ may reduce the acoustic wave that is leaked from the first resonator 101 and that enters the second resonator 102, or reduce the acoustic wave that is leaked from the second resonator 102 and that enters the first resonator 101. The second part 10312$a$ or an intersection position of the first part 10311$a$ and the second part 10312$a$ may reduce the acoustic wave that is leaked from the first resonator 101 in the oblique direction and that enters the third resonator 105, or reduce an acoustic wave that is leaked from the third resonator 105 in the oblique direction and that enters the first resonator 101.

Herein, for example, an included angle α between the first part 10311$a$ and the second part 10312$a$ may range from 90° to 165°, and an opening of the included angle α between the first part 10311$a$ and the second part 10312$a$ faces the first resonator 101.

For example, the included angle α between the first part 10311$a$ and the second part 10312$a$ may be 90°, 100°, 105°, 130°, 145°, or 165°.

Figure 9:
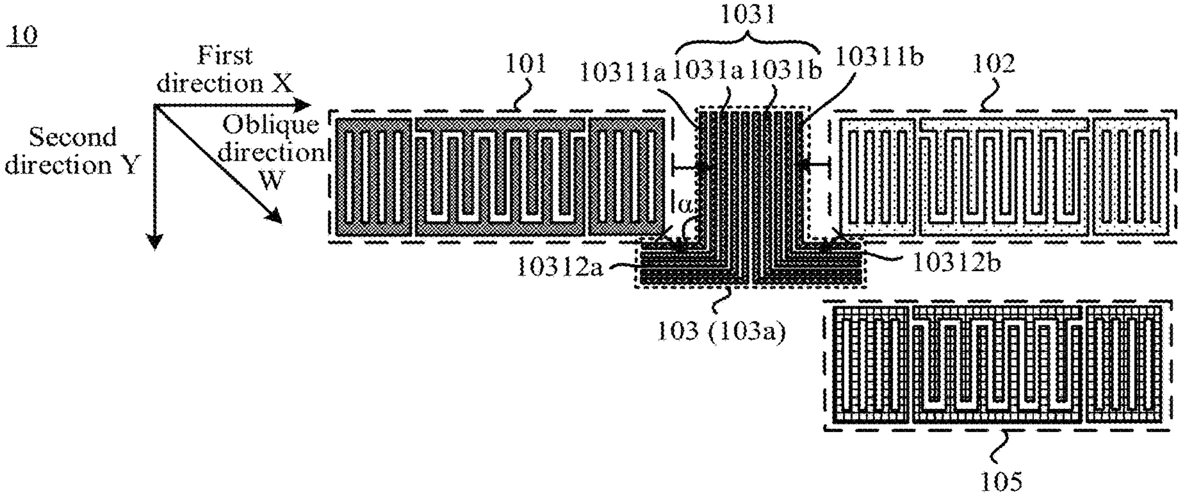
FIG. 9 is a diagram of a structure of an acoustic filter according to still another embodiment of this disclosure.

When the included angle α between the first part 10311$a$ and the second part 10312$a$ ranges from 90° to 165°, FIG. 8 shows that the included angle α between the first part 10311$a$ and the second part 10312$a$ is greater than 90°, and FIG. 9 shows that the included angle α between the first part 10311$a$ and the second part 10312$a$ is 90°.

When the included angle α between the first part 10311$a$ and the second part 10312$a$ ranges from 90° to 165°, the first acoustic wave suppression unit 1031$a$ can more effectively reduce the acoustic wave that is leaked from the first resonator 101 and that enters the second resonator 102, or reduce the acoustic wave that is leaked from the second resonator 102 and that enters the first resonator 101, and reduce the acoustic wave that is leaked from the first resonator 101 in the oblique direction and that enters the third resonator 105, or reduce the acoustic wave that is leaked from the third resonator 105 in the oblique direction and that enters the first resonator 101.

To improve a suppression effect of the second part 10312$a$ on the acoustic wave leaked from the first resonator 101 in the oblique direction, in some examples, the second part 10312$a$ is perpendicular to a propagation direction of the acoustic wave leaked from the first resonator 101 in the oblique direction.

Figure 10:
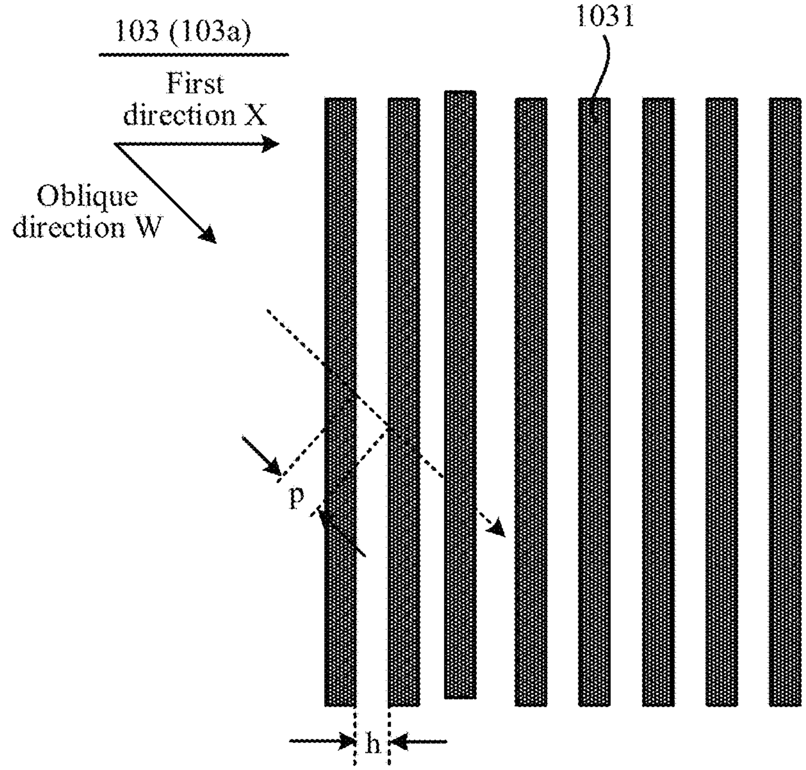
FIG. 10 is a diagram of a structure of a first acoustic wave suppression structure according to an embodiment of this disclosure.

It may be understood that, an acoustic wave propagated in the first direction X may be generated inside the first resonator 101. Therefore, in addition to the acoustic wave propagated in the first direction X, the first resonator 101 may further leak an acoustic wave propagated in an oblique direction W. When the acoustic wave suppression unit group 103$a$ in the first acoustic wave suppression structure 103 includes a plurality of acoustic wave suppression units 1031, for example, a cross-sectional shape of the acoustic wave suppression unit 1031 is a rectangle shape. Refer to FIG. 10. A spacing h between two adjacent acoustic wave suppression units 1031 in the first direction X is different from a spacing p between two adjacent acoustic wave suppression units 1031 in the oblique direction W, where p is greater than h, and spacings (for example, h and p) between adjacent acoustic wave suppression units 1031 affect a stopband generated by the first acoustic wave suppression structure 103. Therefore, a stopband corresponding to a stopband effect of the plurality of acoustic wave suppression units 1031 in the first direction X is different from a stopband corresponding to a stopband effect of the plurality of acoustic wave suppression units 1031 in the oblique direction W. Frequency bands of the leaked acoustic wave are the same regardless of whether the acoustic wave leaked from the first resonator 101 is propagated in the first direction X or propagated in the oblique direction. In this case, when the first acoustic wave suppression structure 103 is designed, for the leaked acoustic wave propagated in the first direction X, an objective that a stopband generated by the first acoustic wave suppression structure 103 in the first direction X can be used to effectively reduce the acoustic wave that is leaked from the first resonator 101 and that is propagated in the first direction X can be achieved. However, stopbands generated by the plurality of acoustic wave suppression units 1031 in the first direction X are different from stopbands generated by the plurality of acoustic wave suppression units 1031 in the oblique direction W. Therefore, for the leaked acoustic wave propagated in the oblique direction W, a case in which a stopband generated by the first acoustic wave suppression structure 103 in the oblique direction W cannot be used to effectively reduce the acoustic wave that is leaked from the first resonator 101 and that is propagated in the oblique direction W exists. As a result, a suppression effect of the first acoustic wave suppression structure 103 in the oblique direction W is affected.

Figure 11:
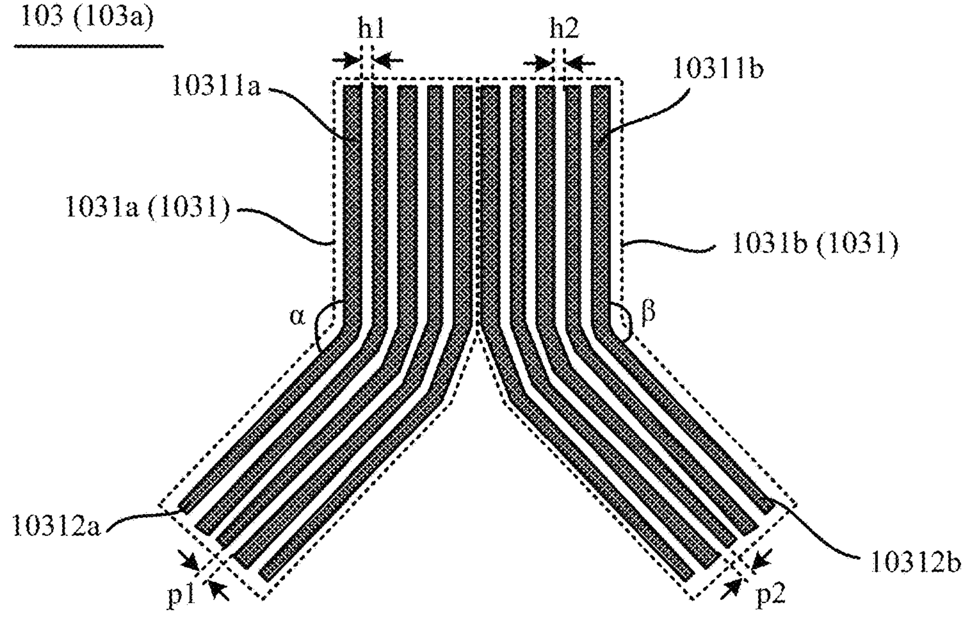
FIG. 11 is a diagram of a structure of a first acoustic wave suppression structure according to another embodiment of this disclosure.

Based on this, considering that the frequency bands of the leaked acoustic waves are the same regardless of whether the acoustic waves leaked from the first resonator 101 is propagated in the first direction X or propagated in the oblique direction, when the first acoustic wave suppression unit 1031$a$ includes the first part 10311$a$ and the second part 10312$a$, a spacing h1 between adjacent first parts 10311$a$ affects stopbands generated by a plurality of first parts 10311$a$, and a spacing p1 between adjacent second parts 10312$a$ affects stopbands generated by a plurality of second parts 10312$a$, to ensure that the first part 10311$a$ can suppress the acoustic wave that is leaked from the first resonator 101 and that is propagated in the first direction X, and ensure that the second part 10312$a$ can suppress the acoustic wave that is leaked from the first resonator 101 and that is propagated in the oblique direction, in some examples, as shown in FIG. 11, in a same acoustic wave suppression unit group 103$a$, a spacing h1 between adjacent first parts 10311$a$ is equal to a spacing p1 between adjacent second parts 10312$a$.

In the same acoustic wave suppression unit group 103$a$, the spacing h1 between the adjacent first parts 10311$a$ is equal to the spacing p1 between the adjacent second parts 10312$a$. Therefore, in the same acoustic wave suppression unit group 103*a*, stopbands generated by a plurality of first parts 10311*a* are the same as stopbands generated by a plurality of second parts 10312*a*. In this case, acoustic waves that are of a same frequency band and that are leaked from the first resonator 101 can be suppressed by the plurality of first parts 10311*a* when leaked in the first direction X, and can be suppressed by the plurality of second parts 10312*a* when leaked in the oblique direction such that it is ensured that stopband effects are basically the same in all directions, and a suppression effect of the first acoustic wave suppression unit 1031*a* is improved.

In some other examples, in a same acoustic wave suppression unit group 103*a*, a spacing h1 between adjacent first parts 10311*a* is not equal to a spacing p1 between adjacent second parts 10312*a*.

Figure 12:
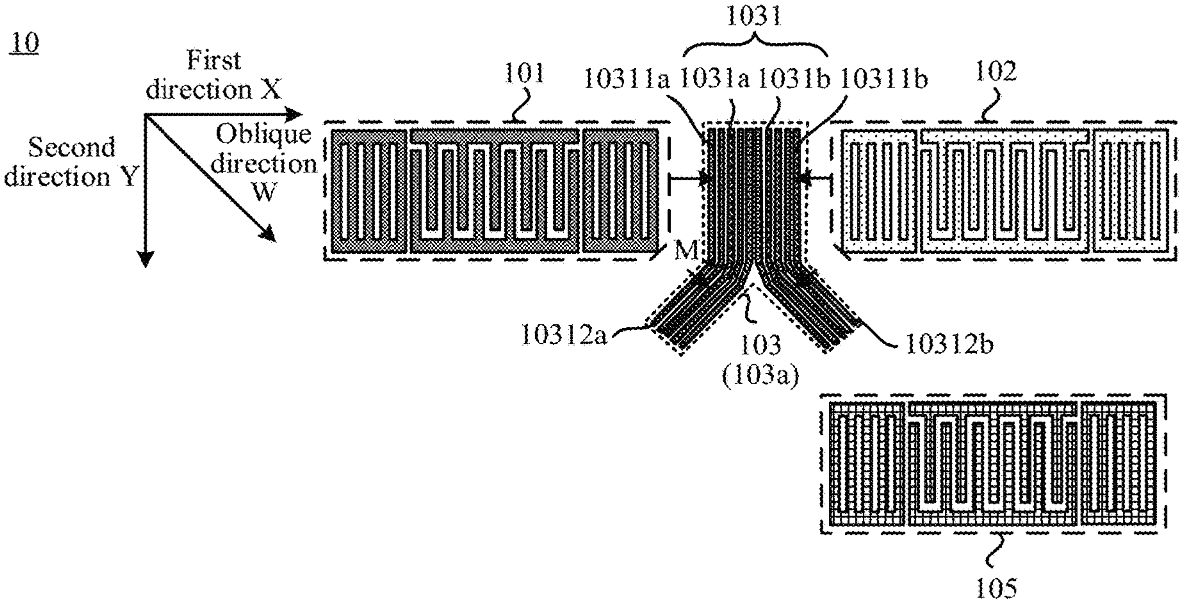
FIG. 12 is a diagram of a structure of an acoustic filter according to still another embodiment of this disclosure.

In this embodiment of this disclosure, for the first acoustic wave suppression unit 1031*a*, when the first acoustic wave suppression unit 1031*a* includes the first part 10311*a* and the second part 10312*a*, in some examples, as shown in FIG. 8, a projection that is of the first end M (namely, an end connected to the first end of the second part 10312*a* in the first part 10311*a*) of the first part 10311*a* and that is in the first direction X is inside the first resonator 101. In some other examples, as shown in FIG. 12, in the first direction X, the first end M of the first part 10311*a* is flush with the first resonator 101, or a projection that is of the first end M of the first part 10311*a* and that is in the first direction X is outside the first resonator 101.

It may be understood that, in the first acoustic wave suppression unit 1031*a*, the first part 10311*a* is mainly configured to suppress the acoustic wave that is leaked from the first resonator 101 and that is propagated in the first direction X, and the second part 10312*a* is mainly configured to suppress the acoustic wave that is leaked from the first resonator 101 and that is propagated in the oblique direction W. Therefore, when the first end M of the first part 10311*a* is flush with the first resonator 101 in the first direction X, or the projection that is of the first end M of the first part 10311*a* and that is in the first direction X is outside the first resonator 101, it can be ensured that all acoustic waves that are leaked from the first resonator 101 and that are propagated in the first direction X can be suppressed by the first part 10311*a*.

Figure 13A:
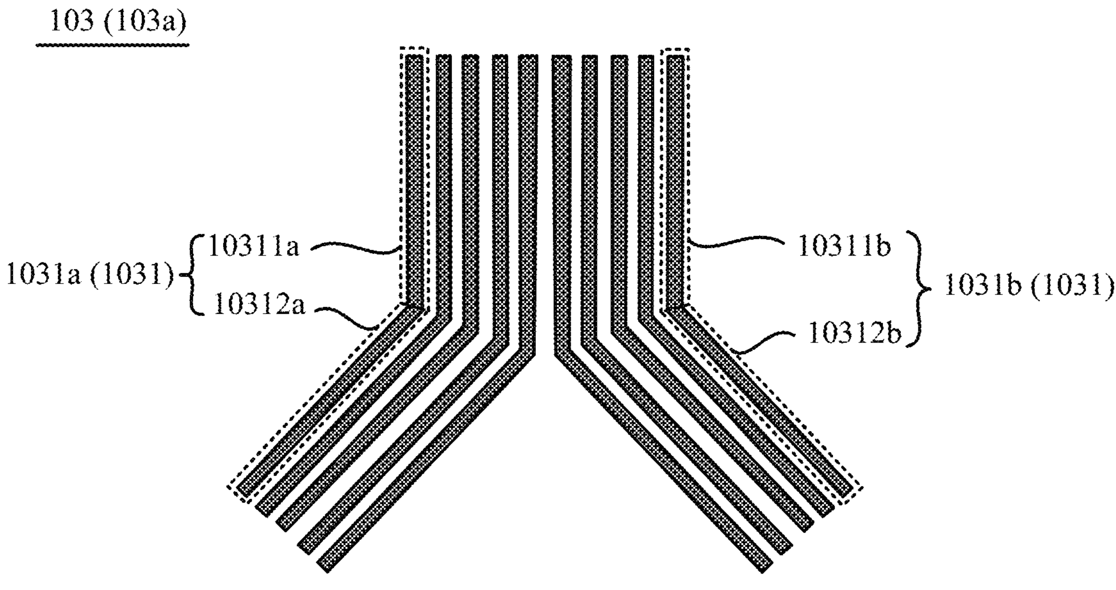
FIG. 13A is a diagram of a structure of a first acoustic wave suppression structure according to still another embodiment of this disclosure.

Based on this, for the first acoustic wave suppression unit 1031*a*, when the first acoustic wave suppression unit 1031*a* includes the first part 10311*a* and the second part 10312*a*, in some examples, as shown in FIG. 13A, the second part 10312*a* and the first part 10311*a* are directly connected together.

Figure 13B:
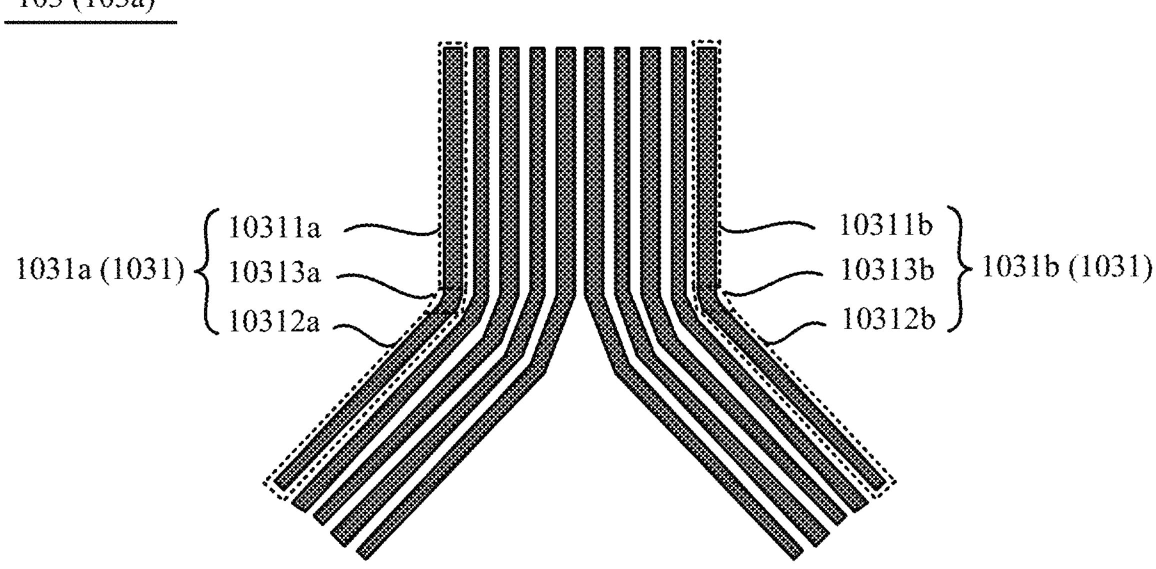
FIG. 13B is a diagram of a structure of a first acoustic wave suppression structure according to still another embodiment of this disclosure.

In some other examples, as shown in FIG. 13B, the second part 10312*a* and the first part 10311*a* are connected together by using another mechanical part. For example, the first acoustic wave suppression unit 1031*a* further includes a first connection part 10313*a*, the first connection part 10313*a* is disposed between the first part 10311*a* and the second part 10312*a*, one end of the first connection part 10313*a* is connected to the first end of the first part 10311*a*, and the other end of the first connection part 10313*a* is connected to the first end of the second part 10312*a*.

In this embodiment of this disclosure, an included angle between the first part 10311*a* and the first connection part 10313*a* is different from an included angle between the second part 10312*a* and the first connection part 10313*a*.

Herein, the first connection part 10313*a* and the first part 10311*a* and the second part 10312*a* may be an integrated structure, in other words, the first part 10311*a*, the second part 10312*a*, and the first connection part 10313*a* may be simultaneously manufactured through an integrated process. Alternatively, the first connection part 10313*a*, the first part 10311*a*, and the second part 10312*a* may be three independent structures, in other words, the first connection part 10313*a*, the first part 10311*a*, and the second part 10312*a* may be separately formed through a plurality of processes.

In addition, a material of the first connection part 10313*a*, a material of the first part 10311*a*, and a material of the second part 10312*a* may be the same, or may be different.

It should be understood that the second part 10312*a* and the first part 10311*a* may be connected together by using one first connection part 10313*a*, but this is not limited. For example, the second part 10312*a* and the first part 10311*a* may be connected by using a plurality of first connection parts 10313*a* that are connected together in sequence, and included angles between the plurality of first connection parts 10313*a* and the first part 10311*a* may be different.

When the first acoustic wave suppression unit 1031*a* further includes the first connection part 10313*a*, the first connection part 10313*a* is disposed between the first part 10311*a* and the second part 10312*a*, and the first part 10311*a* and the second part 10312*a* are connected together by using the first connection part 10313*a*, a problem that is caused by a sharp angle due to a direct connection between the first part 10311*a* and the second part 10312*a* and that affects the filtering performance of the acoustic filter 10 can be avoided. In addition, process difficulty in manufacturing the first acoustic wave suppression unit 1031*a* can be reduced.

Figure 14:
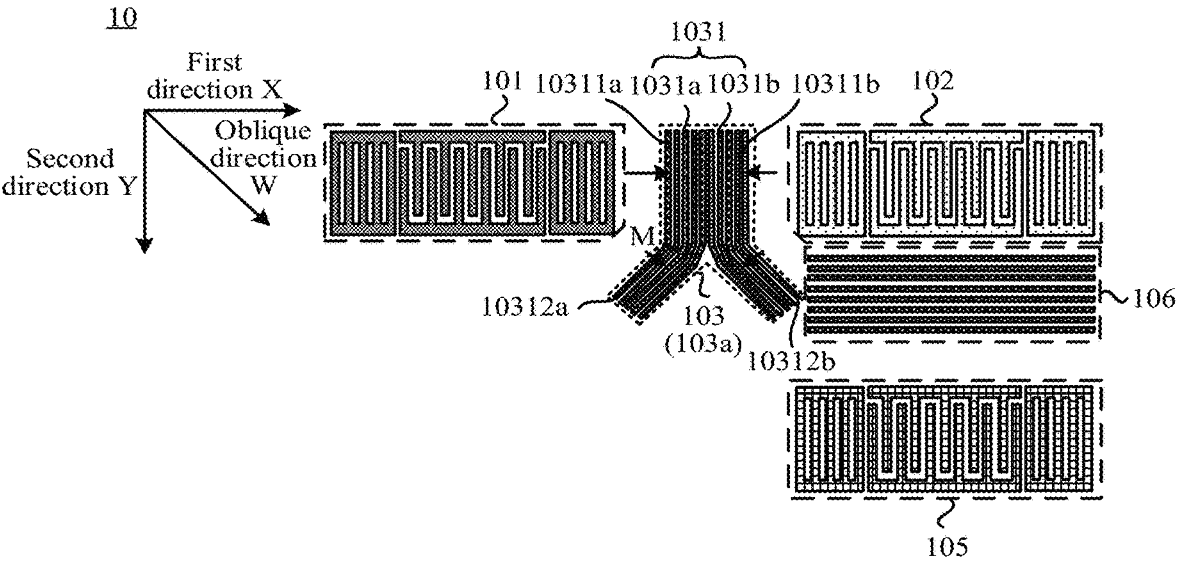
FIG. 14 is a diagram of a structure of an acoustic filter according to still another embodiment of this disclosure.

When the acoustic filter 10 further includes the third resonator 105, the second resonator 102 and the third resonator 105 are arranged in the second direction Y, and an acoustic wave propagated in the second direction Y may be generated inside the second resonator 102, and/or an acoustic wave propagated in the second direction Y may be generated inside the third resonator 105, to reduce an acoustic wave that is leaked from the second resonator 102 and propagated in the second direction Y and that enters the third resonator 105 or prevent the acoustic wave that is leaked from the second resonator 102 and propagated in the second direction Y from entering the third resonator 105, or reduce an acoustic wave that is leaked from the third resonator 105 and propagated in the second direction Y and that enters the second resonator 102 or prevent the acoustic wave that is leaked from the third resonator 105 and propagated in the second direction Y from entering the second resonator 102, in some examples, as shown in FIG. 14, the acoustic filter 10 may further include a second acoustic wave suppression structure 106. The second acoustic wave suppression structure 106 is disposed between the second resonator 102 and the third resonator 105, and at least one stopband generated by the second acoustic wave suppression structure 106 is used to reduce an acoustic wave that is leaked between the second resonator 102 and the third resonator 105 and that is propagated in the second direction Y.

It may be understood that, when the second acoustic wave suppression structure 106 is designed, the specific frequency band of the acoustic filter 10 may be covered by using the at least one stopband generated by the second acoustic wave suppression structure 106, to achieve an objective of reducing, by using the at least one stopband generated by the second acoustic wave suppression structure 106, the acoustic wave that is leaked between the second resonator 102 and the third resonator 105 and that is propagated in the second direction Y, that is, reducing a spur caused by the acoustic wave that is leaked between the second resonator 102 and the third resonator 105 and that is propagated in the second direction Y such as to reduce the acoustic wave that is leaked from the second resonator 102 and propagated in the second direction Y and that enters the third resonator 105 or prevent the acoustic wave that is leaked from the second resonator 102 and propagated in the second direction Y from entering the third resonator 105, or reduce the acoustic wave that is leaked from the third resonator 105 and propagated in the second direction Y and that enters the second resonator 102 or prevent the acoustic wave that is leaked from the third resonator 105 and that is propagated in the second direction Y from entering the second resonator 102 such that the filtering performance of the acoustic filter 10 is improved.

A specific structure of the second acoustic wave suppression structure 106 is not limited in this embodiment of this disclosure, provided that the at least one stopband generated by the second acoustic wave suppression structure 106 can be used to reduce the acoustic wave that is leaked between the second resonator 102 and the third resonator 105 and that is propagated in the second direction Y.

Herein, for the structure of the second acoustic wave suppression structure 106, refer to the structure of the first acoustic wave suppression structure 103. For example, the second acoustic wave suppression structure 106 may include at least one acoustic wave suppression unit group, and each acoustic wave suppression unit group includes a plurality of acoustic wave suppression units 1031. The plurality of acoustic wave suppression units 1031 in the acoustic wave suppression unit group are arranged in sequence in the second direction Y at a same spacing, that is, the plurality of acoustic wave suppression units 1031 in the acoustic wave suppression unit group are periodically arranged in the second direction Y.

It may be understood that a periodicity of the plurality of acoustic wave suppression units 1031 in the acoustic wave suppression unit group of the first acoustic wave suppression structure 103 and a periodicity of the plurality of acoustic wave suppression units 1031 in the acoustic wave suppression unit group of the second acoustic wave suppression structure 106 may be the same, or may be different.

When the acoustic wave suppression unit group of the second acoustic wave suppression structure 106 includes a plurality of acoustic wave suppression units 1031, for a design, a shape, a material, and the like of a structure of the acoustic wave suppression unit 1031 in the acoustic wave suppression unit group of the second acoustic wave suppression structure 106, refer to the acoustic wave suppression unit 1031 in the acoustic wave suppression unit group of the first acoustic wave suppression structure 103. Details are not described herein again.

In addition, the first acoustic wave suppression structure 103 and the second acoustic wave suppression structure 106 may be connected together, or may not be connected to each other. When the first acoustic wave suppression structure 103 includes a plurality of acoustic wave suppression units 1031, and the second acoustic wave suppression structure 106 includes a plurality of acoustic wave suppression units 1031, the plurality of acoustic wave suppression units 1031 in the first acoustic wave suppression structure 103 and the plurality of acoustic wave suppression units 1031 in the second acoustic wave suppression structure 106 may be connected together in one-to-one correspondence, or may not be connected.

Figure 15:
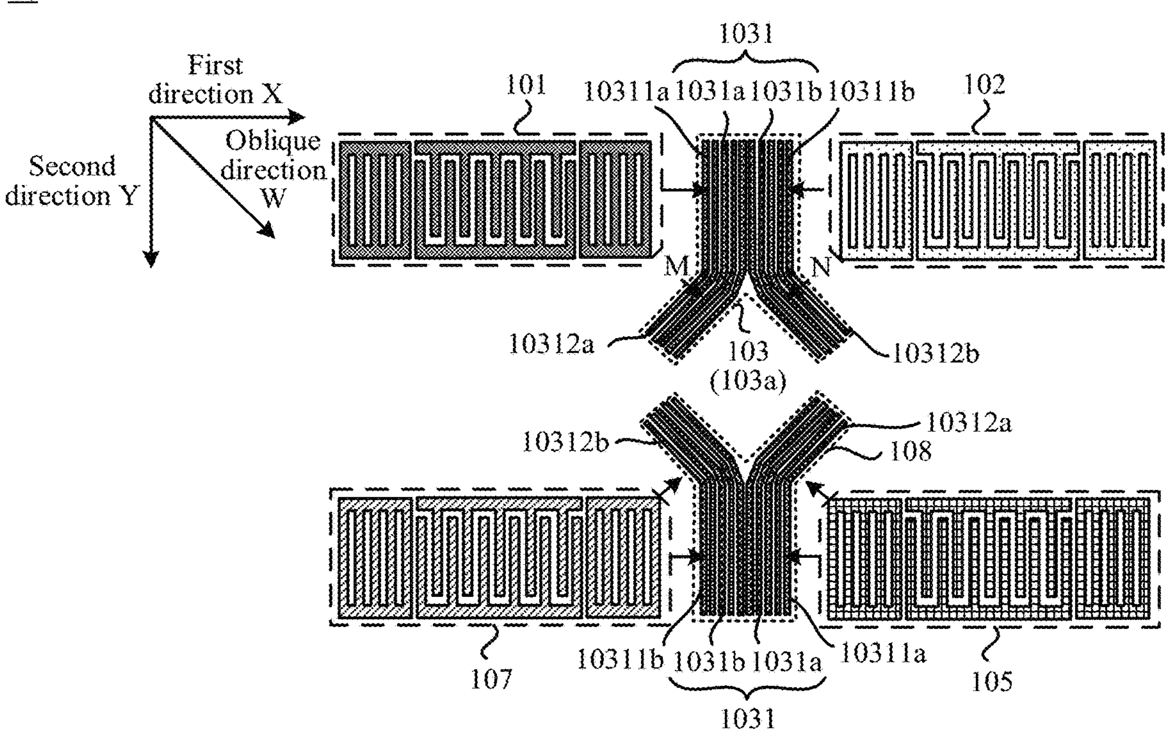
FIG. 15 is a diagram of a structure of an acoustic filter according to still another embodiment of this disclosure.

Based on the foregoing descriptions, in some examples, as shown in FIG. 15, the acoustic filter 10 further includes a fourth resonator 107, and the first resonator 101 and the fourth resonator 107 are arranged in the second direction Y. The second acoustic wave suppression unit **1031*b* is configured to reduce the acoustic wave that is leaked from the first resonator 101 and that enters the second resonator 102, or reduce the acoustic wave that is leaked from the second resonator 102 and that enters the first resonator 101. In addition, the second acoustic wave suppression unit 1031*b* may be further configured to reduce an acoustic wave that is leaked from the second resonator 102 and that enters the fourth resonator 107, or reduce an acoustic wave that is leaked from the fourth resonator 107 and that enters the second resonator 102**.

Herein, for a structure of the fourth resonator 107, refer to the foregoing structures of the first resonator 101 and the second resonator 102. Details are not described herein again.

Refer to FIG. 15. When the acoustic filter 10 further includes the fourth resonator 107, and the first resonator 101 and the fourth resonator 107 are arranged in the second direction Y, there may be an acoustic wave leaked in the oblique direction in the second resonator 102, and the acoustic wave leaked in the oblique direction may affect the fourth resonator 107. Alternatively, there may be an acoustic wave leaked in the fourth resonator 107 in the oblique direction, and the acoustic wave leaked in the oblique direction may affect the second resonator 102. However, in this embodiment of this disclosure, the second acoustic wave suppression unit **1031*b* not only can reduce the acoustic wave that is leaked from the first resonator 101 and that enters the second resonator 102, or reduce the acoustic wave that is leaked from the second resonator 102 and that enters the first resonator 101, but also can reduce the acoustic wave that is leaked from the second resonator 102 and that enters the fourth resonator 107, or reduce the acoustic wave that is leaked from the fourth resonator 107 and that enters the second resonator 102 such that the filtering performance of the acoustic filter 10** can be improved.

A structure of the second acoustic wave suppression unit **1031*b* is not limited in this embodiment of this disclosure, provided that the second acoustic wave suppression unit 1031*b* not only can reduce the acoustic wave that is leaked from the first resonator 101 and that enters the second resonator 102, or reduce the acoustic wave that is leaked from the second resonator 102 and that enters the first resonator 101, but also can reduce the acoustic wave that is leaked from the second resonator 102 and that enters the fourth resonator 107, or reduce the acoustic wave that is leaked from the fourth resonator 107 and that enters the second resonator 102. In some examples, as shown in FIG. 15, the second acoustic wave suppression unit 1031*b* includes a third part 10311*b* and a fourth part 10312*b*, the fourth part 10312*b* is closer to the fourth resonator 107 than the third part 10311*b*, a first end of the fourth part 10312*b* is connected to a first end of the third part 10311*b*, and the third part 10311*b* and the fourth part 10312*b*** are not parallel.

The third part **10311*b* is located between the first resonator 101 and the second resonator 102, and the third part 10311*b*** may extend in the second direction Y, where the second direction Y is perpendicular to the first direction X.

It should be noted that, for designs of the third part **10311*b* and the fourth part 10312*b* in the second acoustic wave suppression unit 1031*b*, refer to the foregoing designs of the first part 10311*a* and the second part 10312*a* in the first acoustic wave suppression unit 1031*a***.

When the second acoustic wave suppression unit **1031*b* includes the third part 10311*b* and the fourth part 10312*b*, the third part 10311*b* can reduce the acoustic wave that is leaked from the first resonator 101 and that enters the second resonator 102, or reduce the acoustic wave that is leaked from the second resonator 102 and that enters the first resonator 101. The fourth part 10312*b* or an intersection position of the third part 10311*b* and the fourth part 10312*b* can reduce the acoustic wave that is leaked from the second resonator 102 and that enters the fourth resonator 107, or reduce the acoustic wave that is leaked from the fourth resonator 107 and that enters the second resonator 102**.

Herein, the third part **10311*b* and the fourth part 10312*b* may be an integrated structure, or the third part 10311*b* and the fourth part 10312*b*** may be two independent structures.

In addition, a material of the third part **10311*b* and a material of the fourth part 10312*b*** may be the same, or may be different.

In addition, for example, an included angle R between the third part **10311*b* and the fourth part 10312*b* may range from 90° to 165°, and an opening of the included angle β between the third part 10311*b* and the fourth part 10312*b* faces the second resonator 102**.

For example, the included angle β between the third part **10311*b* and the fourth part 10312*b*** may be 90°, 100°, 105°, 130°, 145°, or 165°.

When the included angle β between the third part **10311*b* and the fourth part 10312*b* ranges from 900 to 165°, the second acoustic wave suppression unit 1031*b* can more effectively reduce the acoustic wave that is leaked from the first resonator 101 and that enters the second resonator 102, or reduce the acoustic wave that is leaked from the second resonator 102 and that enters the first resonator 101, and reduce the acoustic wave that is leaked from the second resonator 102 and that enters the fourth resonator 107, or reduce the acoustic wave that is leaked from the fourth resonator 107 and that enters the second resonator 102**.

It should be noted that the included angle α between the second part **10312*a* and the first part 10311*a* and the included angle β between the fourth part 10312*b* and the third part 10311*b*** may be the same, or may be different.

To improve a suppression effect of the fourth part **10312*b* on the acoustic wave leaked from the second resonator 102 in the oblique direction, in some examples, the fourth part 10312*b* is perpendicular to a propagation direction of the acoustic wave leaked from the second resonator 102** in the oblique direction.

In some examples, as shown in FIG. 11, in a same acoustic wave suppression unit group **103*a*, a spacing h2 between adjacent third parts 10311*b* is equal to a spacing p2 between adjacent fourth parts 10312*b***.

In the same acoustic wave suppression unit group **103*a*, the spacing h2 between the adjacent third parts 10311*b* is equal to the spacing p2 between the adjacent fourth parts 10312*b*. Therefore, in the same acoustic wave suppression unit group 103*a*, stopbands generated by a plurality of third parts 10311*b* are the same as stopbands generated by a plurality of fourth parts 10312*b*. In this case, acoustic waves that are of a same frequency band and that are leaked from the second resonator 102 can be suppressed by the plurality of third parts 10311*b* when leaked in the first direction X, and can be suppressed by the plurality of fourth parts 10312*b* when leaked in the oblique direction such that it is ensured that stopband effects are basically the same in all directions, and a suppression effect of the second acoustic wave suppression unit 1031*b*** is further improved.

In some other examples, in a same acoustic wave suppression unit group **103*a*, a spacing h2 between adjacent third parts 10311*b* is not equal to a spacing p2 between adjacent fourth parts 10312*b***.

In this embodiment of this disclosure, for the second acoustic wave suppression unit **1031*b*, when the second acoustic wave suppression unit 1031*b* includes the third part 10311*b* and the fourth part 10312*b*, in some examples, as shown in FIG. 8, a projection that is of the first end N of the third part 10311*b* (namely, an end connected to the first end of the fourth part 10312*b* in the third part 10311*b*) and that is in the first direction X is inside the second resonator 102. In some other examples, as shown in FIG. 15, in the first direction X, the first end N of the third part 10311*b* is flush with the second resonator 102, or a projection that is of the first end N of the third part 10311*b* and that is in the first direction X is outside the second resonator 102**.

It may be understood that, in the second acoustic wave suppression unit **1031*b*, the third part 10311*b* is mainly configured to suppress an acoustic wave that is leaked from the second resonator 102 and that is propagated in the first direction X, and the fourth part 10312*b* is mainly configured to suppress an acoustic wave that is leaked from the second resonator 102 and that is propagated in the oblique direction W. Therefore, when the first end N of the third part 10311*b* is flush with the second resonator 102 in the first direction X, or the projection that is of the first end N of the third part 10311*b* and that is in the first direction X is outside the second resonator 102, it can be ensured that all acoustic waves that are leaked from the second resonator 102 and that are propagated in the first direction X can be suppressed by the third part 10311*b***.

Based on this, for the second acoustic wave suppression unit **1031*b*, when the second acoustic wave suppression unit 1031*b* includes the third part 10311*b* and the fourth part 10312*b*, in some examples, as shown in FIG. 13A, the third part 10311*b* and the fourth part 10312*b*** are directly connected together.

In some other examples, as shown in FIG. 13B, the third part **10311*b* and the fourth part 10312*b* are connected together by using another mechanical part. For example, the second acoustic wave suppression unit 1031*b* further includes a second connection part 10313*b*, the second connection part 10313*b* is disposed between the third part 10311*b* and the fourth part 10312*b*, one end of the second connection part 10313*b* is connected to the first end of the third part 10311*b*, and the other end of the second connection part 10313*b* is connected to the first end of the fourth part 10312*b***.

In this embodiment of this disclosure, an included angle between the third part **10311*b* and the second connection part 10313*b* is different from an included angle between the fourth part 10312*b* and the second connection part 10313*b***.

In addition, for the second connection part **10313*b*, refer to the foregoing first connection part 10313*a***. Details are not described herein again.

It should be understood that the third part **10311*b* and the fourth part 10312*b* may be connected together by using one second connection part 10313*b*, but this is not limited. For example, the third part 10311*b* and the fourth part 10312*b* may be connected by using a plurality of second connection parts 10313*b* that are connected together in sequence, and included angles between the plurality of second connection parts 10313*b* and the third part 10311*b*** may be different.

When the second acoustic wave suppression unit **1031*b* further includes the second connection part 10313*b*, the second connection part 10313*b* is disposed between the third part 10311*b* and the fourth part 10312*b*, and the third part 10311*b* and the fourth part 10312*b* are connected together by using the second connection part 10313*b*, a problem that is caused by a sharp angle due to a direct connection between the third part 10311*b* and the fourth part 10312*b* and that affects the filtering performance of the acoustic filter 10 can be avoided. In addition, process difficulty in manufacturing the second acoustic wave suppression unit 1031***b* can be reduced.

In some examples, the plurality of first acoustic wave suppression units 1031*a* and the plurality of second acoustic wave suppression units 1031*b* in the first acoustic wave suppression structure 103 are symmetrically disposed with respect to an axis of symmetry extending in the second direction Y.

When the plurality of first acoustic wave suppression units 1031*a* and the plurality of second acoustic wave suppression units 1031*b* in the first acoustic wave suppression structure 103 are symmetrically disposed with respect to the axis of symmetry extending in the second direction Y, it can be ensured that a suppression effect of the first acoustic wave suppression structure 103 on an acoustic wave leaked from the first resonator 101 is the same as a suppression effect of the first acoustic wave suppression structure 103 on an acoustic wave leaked from the second resonator 102 such that uniformity of the filtering performance of the acoustic filter 10 can be improved.

When the acoustic filter 10 includes the third resonator 105 and the fourth resonator 107, and an acoustic wave propagated in the first direction X may be generated inside the third resonator 105, and/or an acoustic wave propagated in the first direction X may be generated inside the fourth resonator 107, in some examples, as shown in FIG. 15, the acoustic filter 10 further includes a third acoustic wave suppression structure 108, the third acoustic wave suppression structure 108 is disposed between the third resonator 105 and the fourth resonator 107, and at least one stopband generated by the third acoustic wave suppression structure 108 is used to reduce an acoustic wave that is leaked between the third resonator 105 and the fourth resonator 107 and that is propagated in the first direction X, that is, reduce a spur caused by the acoustic wave that is leaked between the third resonator 105 and the fourth resonator 107 and that is propagated in the first direction X.

In this embodiment of this disclosure, to avoid a case in which an acoustic wave leaked from the third resonator 105 enters the fourth resonator 107, or an acoustic wave leaked from the fourth resonator 107 enters the third resonator 105, the acoustic filter 10 provided in embodiments of this disclosure further includes the third acoustic wave suppression structure 108 disposed between the third resonator 105 and the fourth resonator 107, and the at least one stopband generated by the third acoustic wave suppression structure 108 is used to reduce the acoustic wave that is leaked between the third resonator 105 and the fourth resonator 107 and that is propagated in the first direction X, that is, reduce the spur caused by the acoustic wave that is leaked between the third resonator 105 and the fourth resonator 107 and that is propagated in the first direction X, in other words, the at least one stopband generated by the third acoustic wave suppression structure 108 may be used to attenuate acoustic waves that are of the specific frequency band of the acoustic filter 10 and that are leaked from the third resonator 105 and the fourth resonator 107. In this case, the acoustic wave that is of the specific frequency band of the acoustic filter 10 and that is leaked from the third resonator 105 can be suppressed from entering the fourth resonator 107, or the acoustic wave that is of the specific frequency band of the acoustic filter 10 and that is leaked from the fourth resonator 107 can be suppressed from entering the third resonator 105 such that the filtering performance of the acoustic filter 10 is ensured.

It should be noted that, for a structure of the third acoustic wave suppression structure 108, refer to the foregoing structure of the first acoustic wave suppression structure 103. Details are not described herein again. For example, the third acoustic wave suppression structure 108 may include a plurality of acoustic wave suppression units 1031, and the plurality of acoustic wave suppression units 1031 are arranged in sequence in the first direction X at a same spacing, that is, the plurality of acoustic wave suppression units 1031 are periodically arranged in the first direction X.

The plurality of acoustic wave suppression units 1031 in the third acoustic wave suppression structure 108, which is similar to the first acoustic wave suppression structure 103, may also include a plurality of first acoustic wave suppression units 1031*a* and a plurality of second acoustic wave suppression units 1031*b*. The first acoustic wave suppression unit 1031*a* is close to the third resonator 105, and the second acoustic wave suppression unit 1031*b* is close to the fourth resonator 107. For structures of the first acoustic wave suppression unit 1031*a* and the second acoustic wave suppression unit 1031*b*, refer to the foregoing descriptions. Details are not described herein again. It should be noted that, when the first acoustic wave suppression unit 1031*a* in the third acoustic wave suppression structure 108 includes a first part 10311*a* and a second part 10312*a*, the first part 10311*a* is closer to the third resonator 105 than the second part 10312*a*. When the second acoustic wave suppression unit 1031*b* in the third acoustic wave suppression structure 108 includes a third part 10311*b* and a fourth part 10312*b*, the third part 10311*b* is closer to the fourth resonator 107 than the fourth part 10312*b*.

Figure 16:
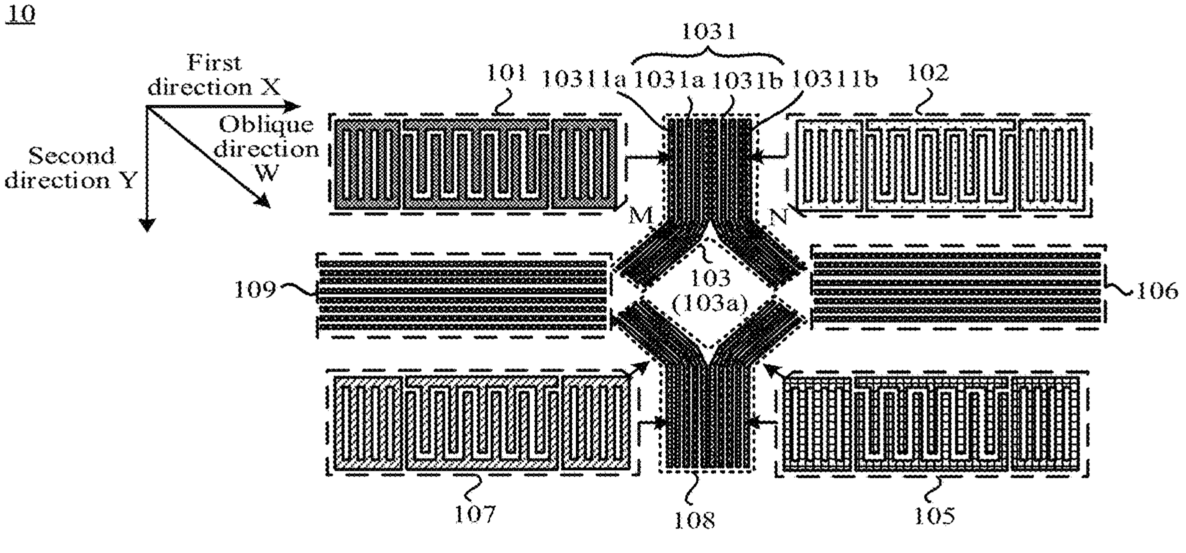
FIG. 16 is a diagram of a structure of an acoustic filter according to still another embodiment of this disclosure.

When the acoustic filter 10 further includes the fourth resonator 107, the first resonator 101 and the fourth resonator 107 are arranged in the second direction Y, and an acoustic wave propagated in the second direction Y may be generated inside the first resonator 101, and/or an acoustic wave propagated in the second direction Y may be generated inside the fourth resonator 107, to reduce an acoustic wave that is leaked from the first resonator 101 and propagated in the second direction Y and that enters the fourth resonator 107 or prevent the acoustic wave that is leaked from the first resonator 101 and propagated in the second direction Y from entering the fourth resonator 107, or reduce an acoustic wave that is leaked from the fourth resonator 107 and propagated in the second direction Y and that enters the first resonator 101 or prevent the acoustic wave that is leaked from the fourth resonator 107 and propagated in the second direction Y from entering the first resonator 101, in some examples, as shown in FIG. 16, the acoustic filter 10 further includes a fourth acoustic wave suppression structure 109. The fourth acoustic wave suppression structure 109 is disposed between the first resonator 101 and the fourth resonator 107, and at least one stopband generated by the fourth acoustic wave suppression structure 109 is used to reduce an acoustic wave that is leaked between the first resonator 101 and the fourth resonator 107 and that is propagated in a second direction Y, that is, reduce a spur caused by the acoustic wave that is leaked between the first resonator 101 and the fourth resonator 107 and that is propagated in the second direction Y.

It may be understood that, when the fourth acoustic wave suppression structure 109 is designed, the specific frequency band of the acoustic filter 10 may be covered by using the at least one stopband generated by the fourth acoustic wave suppression structure 109, to achieve an objective of reducing, by using the at least one stopband generated by the fourth acoustic wave suppression structure 109, the acoustic wave that is leaked between the first resonator 101 and the fourth resonator 107 and that is propagated in the second direction Y such as to reduce an acoustic wave that is leaked from the first resonator 101 and propagated in the second direction Y and that enters the fourth resonator 107 or prevent the acoustic wave that is leaked from the first resonator 101 and that is propagated in the second direction Y from entering the fourth resonator 107, or reduce an acoustic wave that is leaked from the fourth resonator 107 and propagated in the second direction Y and that enters the first resonator 101 or prevent the acoustic wave that is leaked from the fourth resonator 107 and that is propagated in the second direction Y from entering the first resonator 101 such that the filtering performance of the acoustic filter 10 is improved.

A specific structure of the fourth acoustic wave suppression structure 109 is not limited in this embodiment of this disclosure, provided that the at least one stopband generated by the fourth acoustic wave suppression structure 109 can be used to reduce the acoustic wave that is leaked between the first resonator 101 and the fourth resonator 107 and that is propagated in the second direction Y.

Herein, for the structure of the fourth acoustic wave suppression structure 109, refer to the foregoing structure of the second acoustic wave suppression structure 106. Details are not described herein again.

Herein, the fourth acoustic wave suppression structure 109 and the first acoustic wave suppression structure 103 may be connected together, or may not be connected to each other. When the first acoustic wave suppression structure 103 includes a plurality of acoustic wave suppression units 1031, and the fourth acoustic wave suppression structure 109 includes a plurality of acoustic wave suppression units 1031, the plurality of acoustic wave suppression units 1031 in the first acoustic wave suppression structure 103 and the plurality of acoustic wave suppression units 1031 in the fourth acoustic wave suppression structure 109 may be connected together in one-to-one correspondence, or may not be connected. Similarly, the fourth acoustic wave suppression structure 109 and the third acoustic wave suppression structure 108 may be connected together, or may not be connected to each other. When the third acoustic wave suppression structure 108 includes a plurality of acoustic wave suppression units 1031, and the fourth acoustic wave suppression structure 109 includes a plurality of acoustic wave suppression units 1031, the plurality of acoustic wave suppression units 1031 in the third acoustic wave suppression structure 108 and the plurality of acoustic wave suppression units 1031 in the fourth acoustic wave suppression structure 109 may be connected together in one-to-one correspondence, or may not be connected.

Based on the foregoing descriptions, it may be understood that, when the acoustic filter 10 further includes a fifth resonator, and the fifth resonator is disposed between the first resonator 101 and the fourth resonator 107, a structural design of the first acoustic wave suppression structure 103 is similar to a structural design when the acoustic filter 10 includes the fourth resonator 107. Refer to the foregoing structural design of the first acoustic wave suppression structure 103 when the acoustic filter 10 includes the fourth resonator 107. Details are not described herein again. Similarly, when the acoustic filter 10 further includes a sixth resonator, and the sixth resonator is disposed between the second resonator 102 and the third resonator 105, a structural design of the first acoustic wave suppression structure 103 is similar to a structural design when the acoustic filter 10 includes the third resonator 105. Refer to the foregoing structural design of the first acoustic wave suppression structure 103 when the acoustic filter 10 includes the third resonator 105. Details are not described herein again.

The foregoing descriptions are merely specific implementations of this disclosure. However, the protection scope of this disclosure is not limited thereto. Any change or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. An acoustic filter comprising:
- a first resonator arranged in a first direction;
- a second resonator arranged in the first direction; and
- a first acoustic wave suppression structure disposed between the first resonator and the second resonator and configured to generate at least one first stopband to reduce a first acoustic wave that is leaked between the first resonator and the second resonator and that is propagated in the first direction, wherein the first acoustic wave suppression structure has a first length in a second direction, wherein the first resonator has a second length in the second direction, wherein the second resonator has a third length in the second direction, wherein the first length is greater than the second length and/or the third length, and wherein the first direction is perpendicular to the second direction.

2. The acoustic filter of claim 1, wherein the first acoustic wave suppression structure has a first projection in the first direction, wherein the first resonator has a second projection in the first direction, wherein the second resonator has a third projection in the first direction, and wherein the first projection covers the second projection and/or the third projection.

3. The acoustic filter of claim 1, wherein the first acoustic wave suppression structure comprises at least one acoustic wave suppression unit group, wherein each of the at least one acoustic wave suppression unit group comprises first acoustic wave suppression units, and wherein the first acoustic wave suppression units are periodically arranged in the first direction.

4. The acoustic filter of claim 3, wherein the at least one acoustic wave suppression unit group comprises acoustic wave suppression unit groups, and wherein spacings between two adjacent first acoustic wave suppression units in different acoustic wave suppression unit groups are different.

5. The acoustic filter of claim 3, further comprising a third resonator, wherein the second resonator and the third resonator are arranged in a third direction, wherein the first direction is perpendicular to the third direction, and wherein the first acoustic wave suppression units comprise:
- second acoustic wave suppression units proximate to the first resonator and configured to:
  - reduce a second acoustic wave that is leaked from the first resonator and that enters the second resonator or reduce a third acoustic wave that is leaked from the second resonator and that enters the first resonator; and
  - reduce a fourth acoustic wave that is leaked from the first resonator and that enters the third resonator or reduce a fifth acoustic wave that is leaked from the third resonator and that enters the first resonator; and
- third acoustic wave suppression units proximate to the second resonator and configured to:
  - reduce the second acoustic wave; or
  - reduce the third acoustic wave.

6. The acoustic filter of claim 5, wherein each of the second acoustic wave suppression units comprises:

a first part comprising a first end; and a second part located closer to the third resonator than the first part and comprising a second end coupled to the first end, and wherein the first part and the second part are not parallel.

7. The acoustic filter of claim 6, further comprising an included angle between the first part and the second part, wherein the included angle has a value ranging from 90 degrees (°) to 165° and comprises an opening facing the first resonator.

8. The acoustic filter of claim 6, wherein in a same acoustic wave suppression unit group in the at least one acoustic wave suppression unit group, a first spacing between adjacent first parts is equal to a second spacing between adjacent second parts.

9. The acoustic filter of claim 6, wherein the first end is flush with the first resonator in the first direction, or wherein a projection of the first end in the first direction is outside of the first resonator.

10. The acoustic filter of claim 6, wherein each of the second acoustic wave suppression units further comprises a first connection part disposed between the first part and the second part, and wherein the first connection part comprises:

a third end coupled to the first end; and a fourth end coupled to the second end.

11. The acoustic filter of claim 5, further comprising a second acoustic wave suppression structure disposed between the second resonator and the third resonator and configured to generate at least one second stopband to reduce a sixth acoustic wave that is leaked between the second resonator and the third resonator and that is propagated in the third direction.

12. The acoustic filter of claim 5, further comprising a fourth resonator, wherein the first resonator and the fourth resonator are arranged in the third direction, and wherein each of the third acoustic wave suppression units is further configured to:

reduce a sixth acoustic wave that is leaked from the second resonator and that enters the fourth resonator; or reduce a seventh acoustic wave that is leaked from the fourth resonator and that enters the second resonator.

13. The acoustic filter of claim 12, wherein each of the third acoustic wave suppression units comprises:

a first part comprising a first end; and a second part located closer to the fourth resonator than the first part and comprising a second end coupled to the first end, and wherein the first part and the second part are not parallel.

14. The acoustic filter of claim 12, further comprising a second acoustic wave suppression structure disposed between the third resonator and the fourth resonator and configured to generate at least one second stopband to reduce an eighth acoustic wave that is leaked between the third resonator and the fourth resonator and that is propagated in the first direction.

15. The acoustic filter of claim 12, further comprising a second acoustic wave suppression structure disposed between the first resonator and the fourth resonator and configured to generate at least one second stopband to reduce an eighth acoustic wave that is leaked between the first resonator and the fourth resonator and that is propagated in the third direction.

16. The acoustic filter of claim 5, wherein the second acoustic wave suppression units and the third acoustic wave suppression units are symmetrically disposed with respect to an axis of symmetry extending in the third direction.

17. The acoustic filter of claim 1, wherein the first resonator is a first surface acoustic wave (SAW) resonator, wherein the second resonator is a second SAW resonator, wherein each of the first SAW resonator and the second SAW resonator comprises an interdigital transducer (IDT), and wherein the IDT comprises:

a first busbar;

a second busbar disposed opposite to the first busbar;

first electrode fingers that are arranged in sequence in the first direction and that are in contact with the first busbar; and second electrode fingers that are arranged in sequence in the first direction and that are in contact with the second busbar, wherein the first electrode fingers and each of the second electrode fingers are alternately arranged in sequence in the first direction.

18. The acoustic filter of claim 1, wherein the first resonator is a first bulk acoustic wave (BAW) resonator and/or the second resonator is a second BAW resonator.

19. An electronic device, comprising:

a printed circuit board; and an acoustic filter disposed on the printed circuit board and comprising:

a first resonator arranged in a first direction;

a second resonator arranged in the first direction; and an acoustic wave suppression structure disposed between the first resonator and the second resonator and configured to generate at least one stopband to reduce an acoustic wave that is leaked between the first resonator and the second resonator and that is propagated in the first direction, wherein the acoustic wave suppression structure has a first length in a second direction, wherein the first resonator has a second length in the second direction, wherein the second resonator has a third length in the second direction, wherein the first length is greater than the second length and/or the third length, and wherein the first direction is perpendicular to the second direction.

20. The electronic device of claim 19, wherein the acoustic wave suppression structure has a first projection in the first direction, wherein the first resonator has a second projection in the first direction, wherein the second resonator has a third projection in the first direction, and wherein the first projection covers the second projection and/or the third projection.

* * * * *